US009698032B2

(12) United States Patent  
Moesenbichler et al.

(10) Patent No.: US 9,698,032 B2  
(45) Date of Patent: Jul. 4, 2017

(54) MOUNTING SYSTEM AND CHARGING METHOD FOR DISC-SHAPED OBJECTS

(71) Applicant: siconnex customized solutions GmbH, Hof bei Salzburg (AT)

(72) Inventors: Wolfgang Moesenbichler, Fuschl am See (AT); Stefan Muehlbauer, Strasswalchen (AT); Bernhard Kuestner, Neumarkt (AT)

(73) Assignee: siconnex customized solutions GmbH, Hof bei Salzburg (AT)

( * ) Notice: Subject to any disclaimer, the term of this patent is extended or adjusted under 35 U.S.C. 154(b) by 0 days.

(21) Appl. No.: 14/857,949

(22) Filed: Sep. 18, 2015

(65) Prior Publication Data

US 2016/0086833 A1   Mar. 24, 2016

(30) Foreign Application Priority Data

Sep. 19, 2014   (AT) .................................. 50663/2014

(51) Int. Cl.
  *H01L 21/67*   (2006.01)
  *H01L 21/673*   (2006.01)
  *H01L 21/677*   (2006.01)

(52) U.S. Cl.
  CPC .. *H01L 21/67326* (2013.01); *H01L 21/67023* (2013.01); *H01L 21/67028* (2013.01); *H01L 21/67313* (2013.01); *H01L 21/67754* (2013.01); *H01L 21/67781* (2013.01)

(58) Field of Classification Search
  CPC ......... H01L 21/67326; H01L 21/67023; H01L 21/67028; H01L 21/67313; H01L 21/67754; H01L 21/67781; H01L 21/67309; H01L 21/67; H01L 21/67383

USPC ..... 211/41.18; 414/935, 936, 937, 940, 941; 206/710, 454, 832, 711, 833
  See application file for complete search history.

(56) References Cited

U.S. PATENT DOCUMENTS

| 4,300,581 A | * | 11/1981 | Thompson | B08B 3/02 |
| | | | | 134/140 |
| 4,543,059 A | * | 9/1985 | Whang | F27B 5/02 |
| | | | | 219/390 |
| 4,571,850 A | * | 2/1986 | Hunt | F26B 5/08 |
| | | | | 34/242 |
| 4,840,530 A | * | 6/1989 | Nguyen | H01L 21/67313 |
| | | | | 206/453 |

(Continued)

FOREIGN PATENT DOCUMENTS

| EP | 0 579 099 A1 | 1/1994 |
| EP | 1 047 112 A2 | 10/2000 |

*Primary Examiner* — Jennifer E Novosad  
(74) *Attorney, Agent, or Firm* — Collard & Roe, P.C.

(57) ABSTRACT

A mounting system includes retaining bars which are structurally independent of one another, which can be optionally directly disconnected and directly connected relative to a support device through coupling devices that are activatable and deactivatable without tools. Using the mounting system, a method for charging a treatment device can also be carried out, with which the retaining bars are directly connected to a first support device, and following this, the retaining bars are directly connected to a second support device, in particular a rotor that is arranged in the treatment device. Following that, the mechanical connection between the first support device and the retaining bars is directly disconnected.

32 Claims, 10 Drawing Sheets

(56) References Cited

U.S. PATENT DOCUMENTS

Figure 1:
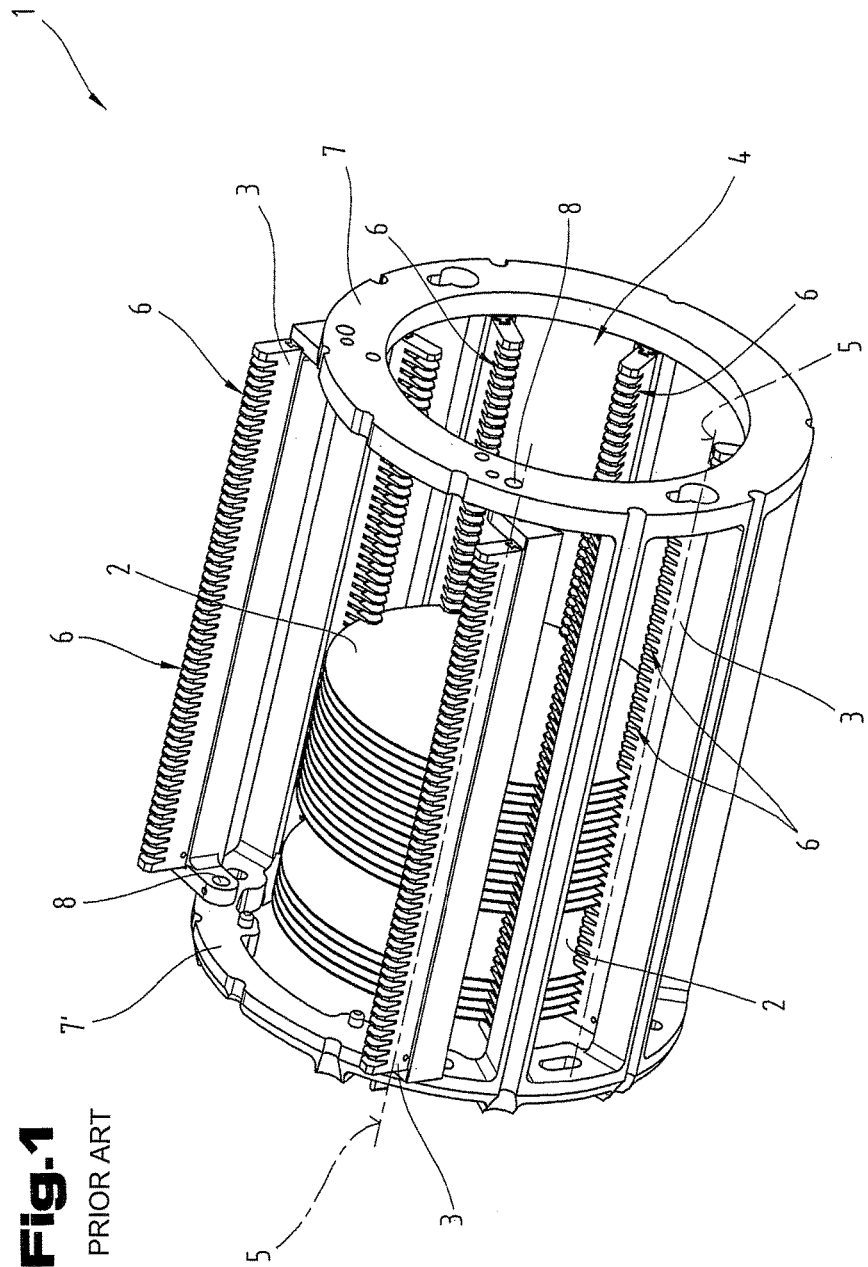

| | | | | |
|---|---|---|---|---|
| 5,000,208 A * | 3/1991 | Ludwig | H01L 21/67028 | 134/102.3 |
| 5,174,045 A * | 12/1992 | Thompson | F26B 5/08 | 210/360.1 |
| 5,232,328 A * | 8/1993 | Owczarz | H01L 21/67028 | 414/590 |
| 5,351,836 A | 10/1994 | Mori et al. | | |
| 5,784,797 A * | 7/1998 | Curtis | H01L 21/67173 | 134/95.2 |
| 5,974,680 A * | 11/1999 | Anderson | H01L 21/67028 | 134/902 |
| 6,125,863 A * | 10/2000 | Bexten | B08B 3/02 | 134/102.3 |
| 6,269,552 B1 * | 8/2001 | Honda | H01L 21/67034 | 34/186 |
| 6,279,724 B1 * | 8/2001 | Davis | H01L 21/67742 | 198/465.2 |
| 6,370,791 B1 * | 4/2002 | Weaver | H01L 21/67313 | 34/109 |
| 6,382,419 B1 | 5/2002 | Fujimori et al. | | |
| 6,532,975 B1 * | 3/2003 | Kamikawa | H01L 21/67051 | 118/500 |
| 6,536,131 B2 * | 3/2003 | Davis | H01L 21/67754 | 34/317 |
| 6,660,104 B2 * | 12/2003 | Thompson | B08B 3/02 | 134/33 |
| 6,942,738 B1 * | 9/2005 | Nelson | H01L 21/67754 | 134/33 |
| 7,067,018 B2 * | 6/2006 | Davis | H01L 21/67754 | 134/33 |
| 7,278,813 B2 * | 10/2007 | Davis | H01L 21/67769 | 414/416.03 |
| 7,520,286 B2 * | 4/2009 | Davis | B08B 9/0826 | 134/153 |
| 8,028,978 B2 * | 10/2011 | Nelson | H01L 21/67754 | 118/728 |
| 2004/0206663 A1 | 10/2004 | Extrand | | |
| 2007/0034252 A1 | 2/2007 | Pellegrin | | |
| 2008/0000851 A1 * | 1/2008 | Pickering | H01L 21/67303 | 211/41.18 |
| 2016/0086833 A1 * | 3/2016 | Moesenbichler | H01L 21/67023 | 29/559 |

* cited by examiner

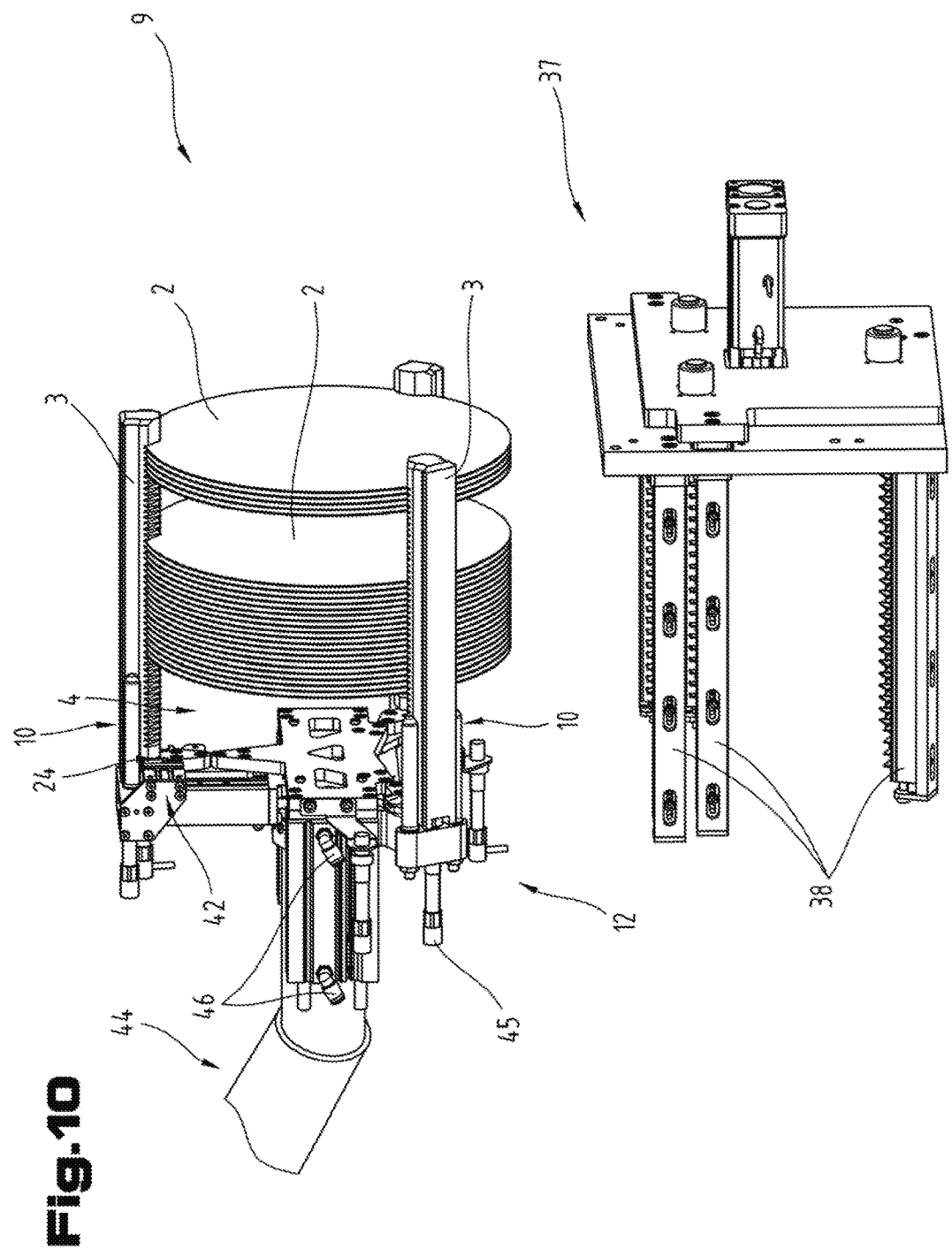

MOUNTING SYSTEM AND CHARGING METHOD FOR DISC-SHAPED OBJECTS

CROSS REFERENCE TO RELATED APPLICATIONS

Applicant claims priority under 35 U.S.C. §119 of Austrian Application No. A 50663/2014 filed on Sep. 19, 2014, the disclosure of which is incorporated by reference.

The invention relates to a mounting system for fixing and mounting disc-shaped objects relative to one another, in a provisioning or treatment position for treating the surfaces of the disc-shaped objects and during a transfer process between different provisioning and treatment stations, and to a method for charging a treatment device. Examples of such disc-shaped objects are compact discs, photo masks, photovoltaic elements, glass substrates and the like. In particular, the invention relates to a mounting system for fixing and mounting (semiconductor) wafers at least in one treatment position, and during a transfer process between different positions. In principle, the shape of the disc-shaped objects can be any, the discs can for example be embodied substantially round or substantially angular.

Such disc-shaped objects are frequently produced from a block of the disc material, wherein the discs are severed from the block of the disc material, for example cut out or sawn out. Following the production of these disc blanks, further production steps can follow, for example for refining the surfaces of the discs, wherein as a rule prior to a completion of the discs, at least one treatment step for example in the form of a cleaning procedure for the surfaces of the disc-shaped objects takes place.

In particular, semiconductor wafers serve as substrate for the production of electronic components, such as integrated circuits (IC), microprocessors, memory chips, micromechanical, photoelectric coatings, and the like. In the process, numerous treatment steps such as for example removal and application processes are sequentially carried out on one or both surfaces of a semiconductor wafer in order to build up a semiconductor element. A semiconductor wafer usually serves as substrate for the production of a plurality of electronic components, for example the production methods for producing the components are carried out in such a manner that preferably the entire surface of a semiconductor wafer is utilised for producing electronic elements. Between the respective production steps for producing the electronic components, cleaning steps are generally also carried out in order to remove contaminations from the surfaces of the wafers. Generally, such a cleaning step takes place by treating the surfaces of the wafer by means of cleaning chemicals in a suitable cleaning or treatment chamber. During the production of semiconductor elements it is always essential that during the course of a treatment step, such as for example an etching process, or during the course of a cleaning step all surfaces or surface sections of all objects that are present in a treatment chamber can be reached by the treatment or cleaning chemicals in as even and comprehensive as possible a manner.

So-called batch spray methods have proved to be particularly effective for treating disc-shaped objects in recent times, during which the surfaces of the discs are sprayed in a suitable treatment chamber by means of process or treatment chemicals. Mostly, the treatment chambers are configured for a treatment procedure for receiving a plurality of semiconductor wafers and the process chemicals are introduced via openings, for example spray nozzles in the lateral walls of a treatment chamber or spray chamber. Frequently, the semiconductor wafers are additionally rotated in the spray chamber during the treatment with the process chemicals. Furthermore it is usual in some cases to conduct gases into a treatment chamber for the treatment of the disc-shaped objects, wherein a treatment gas combined with a treatment liquid. In principle, a treatment of the objects can also or additionally take place mechanically, or for example by means of ultrasound or the like.

From the prior art it is known to mount the disc-shaped objects in a treatment chamber by means of unitary mounting devices. In the process, the disc objects or semiconductor wafers provided for the treatment or cleaning are fixed by the mounting device in their position relative to one another. The mounting devices that are known from the prior art are embodied for example as boxes or for example also in the manner of cages, into which boxes or cages the wafers can be inserted or slid. A stack-like arrangement of the wafers is usual, the wafers being arranged in the cages or boxes parallel to one another and spaced from one another. For fixing the wafers in their position relative to one another, multiple support elements are structurally configured on these known mounting devices, which support elements are formed by side walls, head parts, longitudinal and transverse braces and the like. Such mounting devices are disclosed for example in US 2004/0206663 A1, U.S. Pat. No. 4,300,581 or U.S. Pat. No. 6,536,131 B2.

Disadvantageous with these known, one-piece mounting devices is that the support elements which are structurally configured on the mounting devices, such as for example longitudinal and transverse braces and/or head elements in the manner of support plates or rings, can block a jet or flow of the treatment chemicals introduced or sprayed into a treatment chamber in the direction of the wafer surfaces. By way of these support elements of the known mounting devices, certain regions in the treatment chamber are shadowed in the treatment chamber, so that the respective surface sections of the wafers that are present in such a shadow region cannot be reached by a respective flow or jet, for example of a process liquid or only to a limited extent.

The object of the invention is to create a mounting system, a treatment device and a method by means of which an improved, preferably comprehensive and more even treatment of disc-shaped objects, such as for example semiconductor wafers can be achieved.

On the one hand, this object is solved in that a mounting system for mounting disc-shaped objects, in particular semiconductor wafers, is provisioned in a provisioning or treatment position for treatment of the surfaces of the disc-shaped objects and for mounting the disc-shaped objects during the course of a transfer process between different provisioning or treatment positions. The mounting system comprises at least two retaining bars, wherein each retaining bar along its longitudinal axis comprises support means for the stack-like mounting of the disc-shaped objects in an arrangement that is parallel to one another and spaced from one another. The support means of the retaining bars interact with edge sections of the disc-shaped objects. Between the at least two retaining bars, a receiving space for the disc-shaped objects is formed. Furthermore, the mounting system comprises at least one support device for fixing the retaining bars in their position relative to one another.

According to the invention, the at least two retaining bars are structurally formed independently. For fixing the at least two retaining bars and the disc-shaped objects which are arranged in the receiving space between the retaining bars, at least two first coupling devices that are activatable and deactivatable without tools are formed, through which the retaining bars relative to a first support device are directly disconnectable and directly connectable. Here and in the following, "activatable and deactivatable without tools" is to mean that the activations and deactivations of coupling devices, for example the coupling and decoupling processes for connecting retaining bars with support devices and for disconnecting the retaining bars from support devices, can be carried out without the help of additional hand tools.

Through the features according to the invention a mounting system is created, in which the retaining bars which are structurally formed independently, are not interconnected in a fixed manner, and in particular comprise no connecting pieces or the like relative to one another. Because of this, the quantity of interfering or obstructing elements, which can result in the shadowing of at least parts of the surfaces of the objects to be treated, are at least largely minimised in a treatment chamber. The advantages of the mounting system according to the invention fully develop for example in particular when the disc-shaped objects are treated in a spray chamber, in which spray chamber a treatment liquid via openings, spray nozzles or the like which are arranged on the interior walls of the chamber, is conducted in the direction of the objects to be treated. In particular, as few elements as possible are arranged in the treatment chamber which could block or cut off a flow or jet of the treatment liquid directed at the surfaces of the disc-shaped objects. Because of this, an improved and as comprehensive and even as possible a treatment of all surface sections of all objects or wafers that are present in the treatment chamber is made possible. In particular, the surface sections of those wafers can also be readily reached by the treatment liquid respectively the treatment chemicals which are arranged at one of the two longitudinal ends of the retaining bars between the retaining bars.

In addition, optimised or shorter treatment times can be achievable through the features according to the invention, since jets of the treatment or process liquid, or of a process gas can at least largely completely and evenly act on all surface sections of the disc-shaped objects. Among other things, this can bring with it advantages with respect to the achievable throughput quantities of objects to be treated. In addition it is possible that the quantity of treatment fluid and/or gas to be employed can be reduced since excess employment of process fluid or treatment chemicals for treating surface regions of the objects that are shadowed respectively difficult to reach for a liquid jet can be avoided. This advantage can be relevant both with respect to economical and also ecological aspects. In addition, over treatment, such as for example over-etching of surface regions or disc-shaped objects during the course of an etching process can be effectively impeded. This can be advantageous in particular with respect to the process reliability.

Support elements which are structurally connected to the retaining bars for fixing the position of the retaining bars relative to one another are rendered obsolete by the mounting system according to the invention. Nevertheless, both automated and manual transfer processes for transferring a stack-like arrangement of disc-shaped objects, for example wafers, can be carried out with the first support device in an efficient and process-reliable manner. In particular, activating and deactivating without tools of the at least two first coupling devices is made possible, so that both a connecting process of the retaining bars to the first support device, and also a disconnecting process of the retaining bars from the first support device, can take place directly. Because of this, the handling of the retaining bars can be carried out substantially more efficiently.

In addition to this, because of the structurally independent design of the retaining bars, it can be achieved that the retaining bars of the mounting system according to the invention, during a treatment of the disc-shaped objects, compared with the mounting devices embodied according to the prior art, are contaminated by the treatment chemicals to a comparatively minor extent. Because of this, cleaning intervals for cleaning the retaining bars can be stretched in time compared with the cleaning intervals for mounting devices embodied according to the prior art.

Finally, the mounting system according to the invention can also be advantageous with respect to improved flexibility, since because of the structurally independently designed retaining bars, the same can be arranged, with respect to their spatial position relative to one another, in principle in any manner. The exact arrangement of the retaining bars in their position relative to one another can be formed variably by means of the coupling devices respectively the first support device according to the invention can be formed variably, as a result of which improved flexibility or adaptability of the mounting system, for example with respect to size and/or shape of the disc-shaped objects can be made available.

Practical can be an embodiment of the mounting system with which at least two second coupling devices that are activatable and deactivatable without tools are formed, through which the retaining bars are optionally directly disconnectable and directly connectable with respect to a second support device. The second support device in this case can be designed in particular as rotor for rotating the disc-shaped objects. Because of this, the retaining bars can be optionally connected to the first or the second support device, or be connected to both the first and the second support device. Efficient and process-reliable transfer of the retaining bars and of the disc-shaped objects that are held between the retaining bars from the first into the second support device and vice versa is made possible for example in this manner. This is also true since the retaining bars during transfer processes can always be held or fixed relative to one another by at least one support device. Because of this, the disc-shaped objects are also securely mounted between the retaining bars in their position relative to one another by means of the retaining bars or in each case activated first and/or second coupling devices. Accordingly, the retaining bars or the disc-shaped objects can be directly, reliably and efficiently introduced into a second support device, in particular a rotor, or following completed treatment, directly removed from the rotor.

Advantageous in this case can be a further configuration with which on assuming the treatment position of the disc-shaped objects the at least two first coupling devices are disconnected and the first support device removed from the retaining bars while the at least two second coupling devices between the retaining bars and the second support device, in particular the rotor for rotating the disc-shaped objects, are activated. In this manner, the retaining bars are connected to the rotor in the treatment position only by means of the at least two second coupling devices, whereas further support elements, in particular the first support device in the treatment position are removed from the retaining bars. Because of this, the advantages with respect to improved uniformity of the treatment of the surfaces of the disc-shaped objects or improved accessibility of all surface sections of the objects by treatment chemicals in the treatment position can be further increased.

Furthermore it can be advantageous to form the at least two first coupling devices in such a manner that the retaining bars during the course of a transfer process of the disc-shaped objects are spatially fixed by means of a single first support device in such a manner that they project from the first support device in the manner of unilaterally supported beams. This design of the retaining bars and of the first support device makes possible for example a particularly efficient transfer of the retaining bars to the rotor. A removal process of the retaining bars from the rotor by means of the first support device can thereby also carried out significantly more efficiently since through the unilateral projecting mounting of the at least two retaining bars on the first support device a longitudinal end of the retaining bars is improved and freely accessible. This in turn facilitates activating the at least two second coupling devices or a connection process for connecting the retaining bars to the rotor or further support devices for mounting the retaining bars.

Also practical can be a configuration variant in the case of which the at least two second coupling devices are designed in such a manner that a rotation of the retaining bars about their longitudinal axes is prevented. Because of this, improved stability of the retaining bars in the second support device or the rotor can be achieved. This improvement comes into force in particular when the rotor is put into rotary motion and possible damage on the disc-shaped objects during rotating can be effectively impeded.

Furthermore it can be advantageous when the retaining bars at their opposite longitudinal ends or over their entire longitudinal extension comprise at least one coupling section, which is designed for the positively joined coupling with at least one coupling element of the first or second support device. In this manner, coupling sections assigned to the retaining bars and coupling elements assigned to the respective support devices are formed so that the first and/or second coupling devices are optionally activatable and deactivatable through the respective coupling of the coupling sections to a respective coupling element. Such a positively joined configuration constitutes a variant that is structurally particularly easily realized yet efficient for configuring the at least two first and second coupling devices. In the process, the coupling sections of the retaining bars are preferably configured in such a manner that they extend over the entire longitudinal extension of the retaining bars without interruption. Accordingly, a basic geometrical limitation of the positively joined connection of retaining bars and support devices can be avoided, respectively the entire length of the retaining bars can be utilized for producing a positively joined connection.

A further practical configuration can be formed in that the coupling sections of the retaining bars are formed by at least one depression, in particular by at least one groove or bore, which groove or bore are formed for the positively joined connection to at least one extension, in particular at least one pin, of the first or the second support device. In this manner, a structurally particularly efficient configuration for the positively joined connection of the retaining bars to the support devices can be made available.

Preferably, the mounting system is designed in such a manner that it comprises three retaining bars. Because of this, adequately reliable mounting of the disc-shaped objects between the retaining bars is ensured on the one hand and the quantity of potentially obstructing shadowing elements in the treatment position respectively in a treatment chamber reduced as much as possible.

The reliability or stability of the mounting of the disc-shaped objects between the retaining bars can be again further improved in that the three retaining bars are positioned about the receiving space for the disc-shaped objects in such a manner that an angle taken up between adjacent retaining bars in each case amounts to approximately 120°. Because of this, high process reliability respectively high mounting reliability for the disc-shaped objects during the rotating of the second support device respectively of the rotor in a treatment chamber is ensured.

Also practical can be a design form, in the case of which the at least two first and the at least two second coupling devices are configured in such a manner that a coupling movement for connecting the retaining bars to the first and the second support device, and a disconnecting movement for disconnecting the retaining bars from the first and the second support device can be carried out parallel to the longitudinal axis of the retaining bars. This configuration of the first and second coupling device makes possible connecting and disconnecting processes through simple linear movements of the first support device in both directions along the longitudinal axis of the retaining bars. Because of this, automated handling, for example by an industrial robot, but also manual handling by an operating person is substantially facilitated. In particular, no complex movement processes for connecting the retaining bars to the support devices are needed.

It can be practical, furthermore, to arrange the rotor in a treatment chamber, which treatment chamber comprises means for feeding in a treatment liquid and/or a treatment gas for the treatment in particular for the chemical cleaning of the disc-shaped objects. Accordingly, a particularly efficient possibility for the uniform treatment of the surfaces of the disc-shaped objects is created. The rotor with the connected retaining bars and the objects mounted between the retaining bars can be rotated in the static treatment chamber while for example by way of openings, nozzles or the like on the interior walls of the treatment chamber, treatment chemicals can be introduced in the direction of the objects. Through the rotation of the objects, such as for example wafers, the even distribution of the process chemicals over all surface sections of the wafer can be effectively supported.

A further practical embodiment provides that by means of the at least two first coupling devices relative movements between the retaining bars and the first support device transversely to the longitudinal axis of the retaining bars are prevented when these assume their activated operating state. In this way, it can be effectively prevented, for example during a transfer process between a provisioning position and a treatment position, that disc-shaped objects become dislodged from their position between the retaining bars in an unintentional or undesired manner.

However, it can also be advantageous to form between the first support device and at least one retaining bar, at least one further optionally activatable and deactivatable coupling device for the optional connecting and disconnecting of the at least one retaining bar with a coupling element of the first support device, and for the option of disabling and enabling of relative movements between the retaining bars and the coupling element in parallel direction to the longitudinal axis of the retaining bars. Through such coupling devices, unintentional or undesired disconnecting of the first coupling devices can be effectively impeded during a transfer process, as a result of which the process reliability or the reliability during a transfer process can be increased even further. In particular, in the case of a purely positively joined configuration of the first coupling devices which merely act in the direction of the longitudinal axes of the retaining bars, a sliding-down of the retaining bars from the first support device, for example during a transfer process, can be effectively impeded.

Here it can be practical that the coupling element comprises at least one locking element, which locking element is designed for the positively joined or frictionally joined interaction with retaining bar. Through such a locking element in turn a variant that is structurally easy to realize yet efficient for locking respectively mounting the retaining bars on the first support device can be provided.

Furthermore it can be practical that on at least one longitudinal end of at least one retaining bar a locking means, in particular a locking groove is provided, which forms at least one locking means for the positively joined interaction with a locking element, in particular a locking extension of the first support device. Through such a configuration of structurally locking grooves each arranged on the retaining bars and locking extensions structurally arranged on the coupling element of the first support device, quick and efficient positively-joined activating and deactivating of the coupling device(s) is made possible. In addition, particularly fail-safe coupling devices can thus be realized.

For example, optional activating and deactivating of the at least one coupling device can be made possible in that the at least one further coupling device, by pivoting the first support device by means of an industrial robot or an operating person about an axis which runs parallel to the longitudinal axis of the retaining bars and substantially through the center of the first support device is optionally activateable and deactivateable. This constitutes a variant that is structurally particularly easy to realize yet efficient for coupling respective locking the retaining bars on the first support device by means of the coupling element. In particular, the automatic handling of the first support device respectively the coupling element by an industrial robot is thereby optimized since activating or deactivating the at least one coupling device requires merely as minimal as possible a rotational movement of the first support device.

Alternatively or additionally it can be advantageous when the coupling element is at least pivotably mounted on the first support device about an axis that is parallel to the longitudinal axis of the retaining bars and substantially runs through the center of the first support device at least so far that the at least one further coupling device is optionally activatable and deactivatable. This configuration variant facilitates in particular manual activating and deactivating of the at least one coupling device by an operating person, since the rotary movement can take place independently of the mounting of the first support device.

Further advantages are achievable in that on the first support device at least one actuating device is arranged, by means of which a relative adjustment between the first support device and the retaining bars in parallel direction to the longitudinal axis of the retaining bars is made possible. In particular, connecting and disconnecting processes for connecting and disconnecting the retaining bars with respectively from the first support device can be accomplished in a particularly efficient manner. However, activating and deactivating further coupling devices, for example for connecting the retaining bars to the second support device respectively the rotor and disconnecting the retaining bars from the rotor can be substantially improved or facilitated by such actuating devices.

Here it can be practical that the at least one actuating device comprises at least one guiding device which runs parallel to the longitudinal axis of the retaining bars. By means of such a guiding device, connecting and disconnecting processes for connecting the retaining bars with support devices can be carried out with high process reliability.

For the mechanical adjusting of the retaining bars relative to the first support device, the at least one actuating device preferably comprises an actuating drive, in particular a pneumatic actuating cylinder. Advantageous in this case is that a means that can be realised in a structurally simple manner, is space-saving yet efficient can thereby be made available for the mechanical adjusting of the retaining bars.

In a further practical configuration it can be provided that by means of the actuating device the coupling element is adjustably mounted in parallel direction to the longitudinal axis of the retaining bars relative to a support body of the first support device.

In particular it can thereby be provided that during an adjusting process of the at least one actuating device the at least one further coupling device is activated and in the process the coupling element of the first support device is effective as driver for the retaining bars. In this way, the coupling element cannot only be utilized for locking the retaining bars on the first support device but the coupling element can also be utilized for adjusting the retaining bars in parallel direction to the longitudinal axis of the retaining bars relative to the support body of the first support device. Additional drivers for the retaining bars which are structurally arranged separately are thus advantageously no longer required.

A further advantage is obtained from dimensioning an available adjusting travel of the actuating device in such a manner that the at least two first coupling devices are optionally activatable and deactivatable by means of the actuating device. Because of this, the retaining bars, by means of the actuating device, are completely disconnectable from the first support device respectively the first support device can be removed from the retaining bars for example following introducing of the retaining bars and the objects arranged between the retaining bars in a rotor.

A further practical configuration is obtained in that at least one of the retaining bars is assigned a linear guide or a pivot mounting, by means of which the retaining bar can be optionally removed from the receiving space for the disc-shaped objects and brought close to the receiving space. In the case of at least one retaining bar that is removed from the receiving space it is made possible that the retaining bars by means of the first support device can be positioned about disc-shaped objects arranged in a provisioning device. Once the at least one retaining bar has completed approaching the receiving space by means of the linear guide, the disc-shaped objects can be mounted between the retaining bars and by means of the first support device transferred for example into a rotor.

Preferably, the linear guide or pivot mounting is assigned an actuating drive, in particular a pneumatic actuating cylinder, for the relative adjustment of the at least one retaining bar. Because of this, a means that is structurally easy to realise and space-saving yet efficient can be made available for the mechanical adjusting of the retaining bars.

Here it can be additionally practical that at least those retaining bars, which are adjustably mounted by means of the linear guide or pivot mounting, are assigned an additional axial locking means, which additional axial locking means is formed for the optional disabling and enabling of relative movements between this retaining bar and the first support device in parallel direction to the longitudinal axis of this retaining bar. By way of this configuration variant, unintentional disconnecting of these retaining bars can be effectively prevented even when the retaining bar by means of the actuating device is positioned removed from the receiving space.

In principle, the first support device can be designed for the automated handling by an automated handling device that is suitably programmed or programmable. To this end, the first support device can for example comprise a connection interface to an industrial robot so that the first support device acts as final effector of the industrial robot.

Alternatively and/or additionally, the first support device however can also be provided for the manual handling by an operating person. Then it can be practical that the first support device comprises at least one, in particular at least two handles for the manually gripping of the first support device by an operating person.

In addition it can be practical that the first support device comprises at least one handle for the manual initiation of actuating movements of the adjustable elements on the first support device. Because of this, manual handling of the first actuating device by an operating person is also made possible.

However, the invention also relates to a treatment device for disc-shaped objects, in particular semiconductor wafers, which device comprises a rotor which is arranged in a treatment chamber, a plurality of outlets for conducting gaseous or liquid chemicals into the treatment chamber, and a charge opening arranged at an axial end of the axis of rotation of the rotor for introducing a plurality of disc-shaped objects to be treated. The treatment device is characterized in that the rotor is provided for the disconnectable receiving of and connecting to retaining bars of the mounting system according to the invention described above. The advantages that can thereby be achieved are equivalent to the advantages resulting from the mounting system according to the invention.

The object of the invention is also solved in that a method for charging a treatment device with a stack-like arrangement of disc-shaped objects is made available, wherein the disc-shaped objects are arranged between at least two retaining bars, which retaining bars, by means of support means, engage on the end sections of the disc-shaped objects in a positively joined manner. According to the invention, the retaining bars are directly connected to a first support device by means of at least one two first coupling devices that are activatable and deactivatable without tools, following this the retaining bars are directly connected to a second support device that is arranged in the treatment device, in particular a rotor by means of at least two second coupling devices that are activatable and deactivatable without tools, and following this the mechanical connection between the first support device and the retaining bars directly disconnected by means of the at least two first coupling devices. Through these measures a method is made available by means of which an improved and as comprehensive as possible and uniform treatment of disc-shaped objects, such as for example semiconductor wafers is achievable. Further advantages of the method are obtained in a manner that is equivalent to the advantages of the mounting system according to the invention already described above, by means of which carrying out the method according to the invention is made possible.

Here, an embodiment of the method can be carried out with which the disc-shaped objects are held between three retaining bars which are arranged evenly distributed over the rotational circumference of the rotor, and by means of three second coupling devices a positively joined connection between the retaining bars and the rotor is established. Through this method procedure, a high method reliability can be achieved, in particular, the disc-shaped objects can be reliably mounted in the rotor by the retaining bars while the rotor is put into rotary motion.

Finally, the method procedure in this case can take place in such a manner that the retaining bars are exclusively held on the respective desired positions on the rotational circumference of the rotor in a positively joined manner by the at least two second coupling devices. Because of this, the quantity of interfering or obstructive elements which can result in the shadowing of at least parts of the surfaces of the objects to be treated in a treatment chamber can be at least largely minimised.

To better understand the invention, the same is explained in more detail by way of the following figures.

Figure 2:
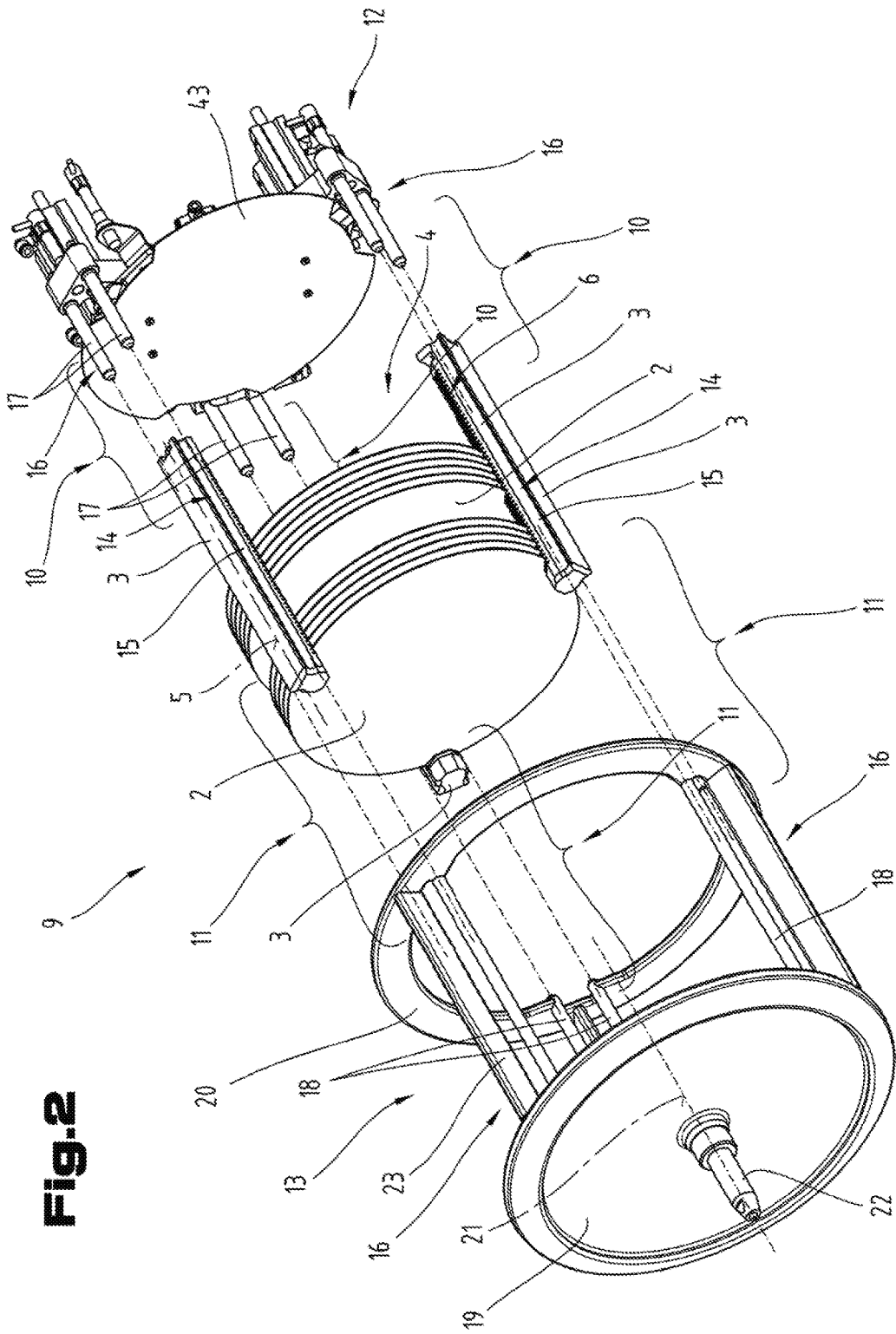
Figure 3:
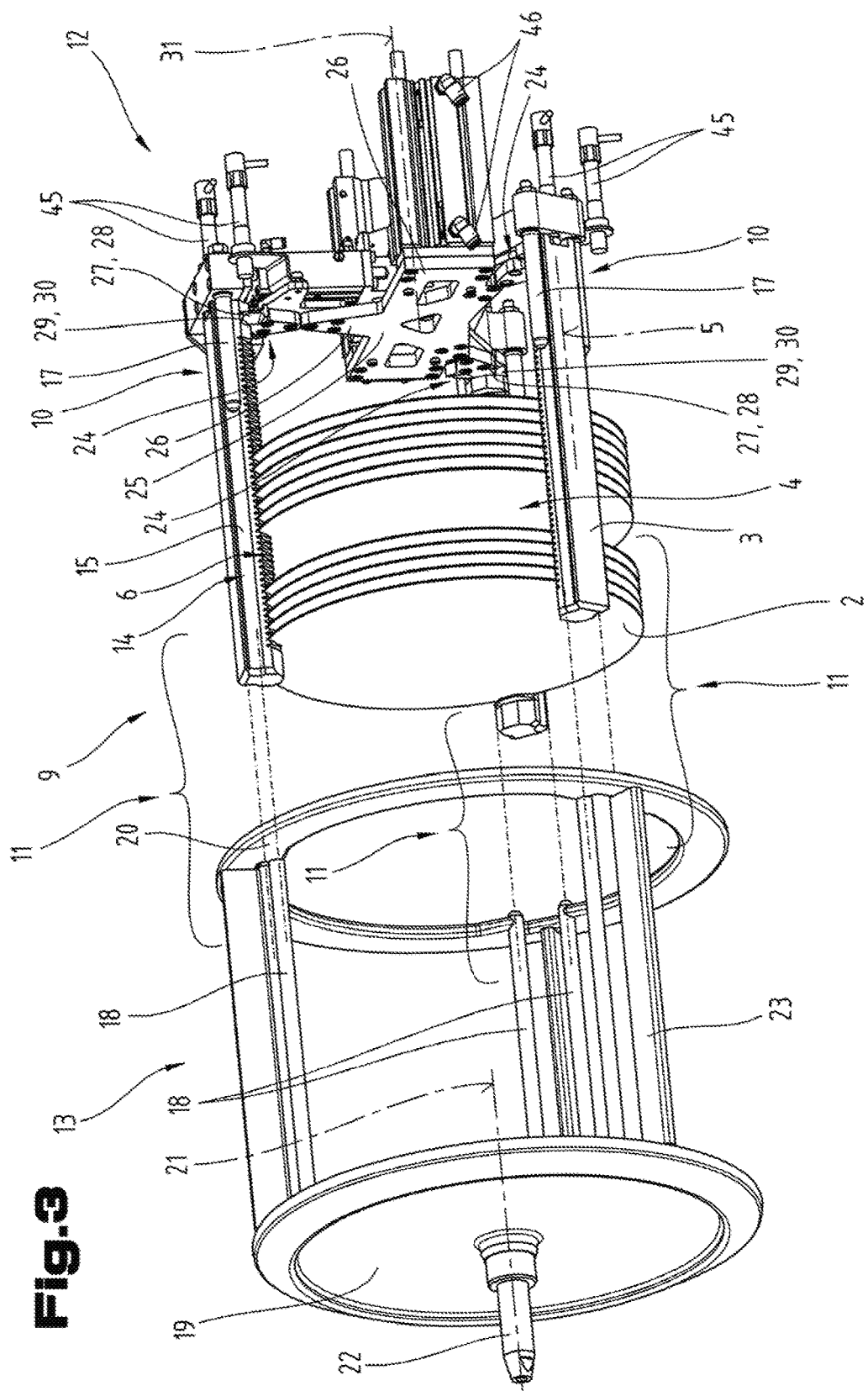
Figure 4:
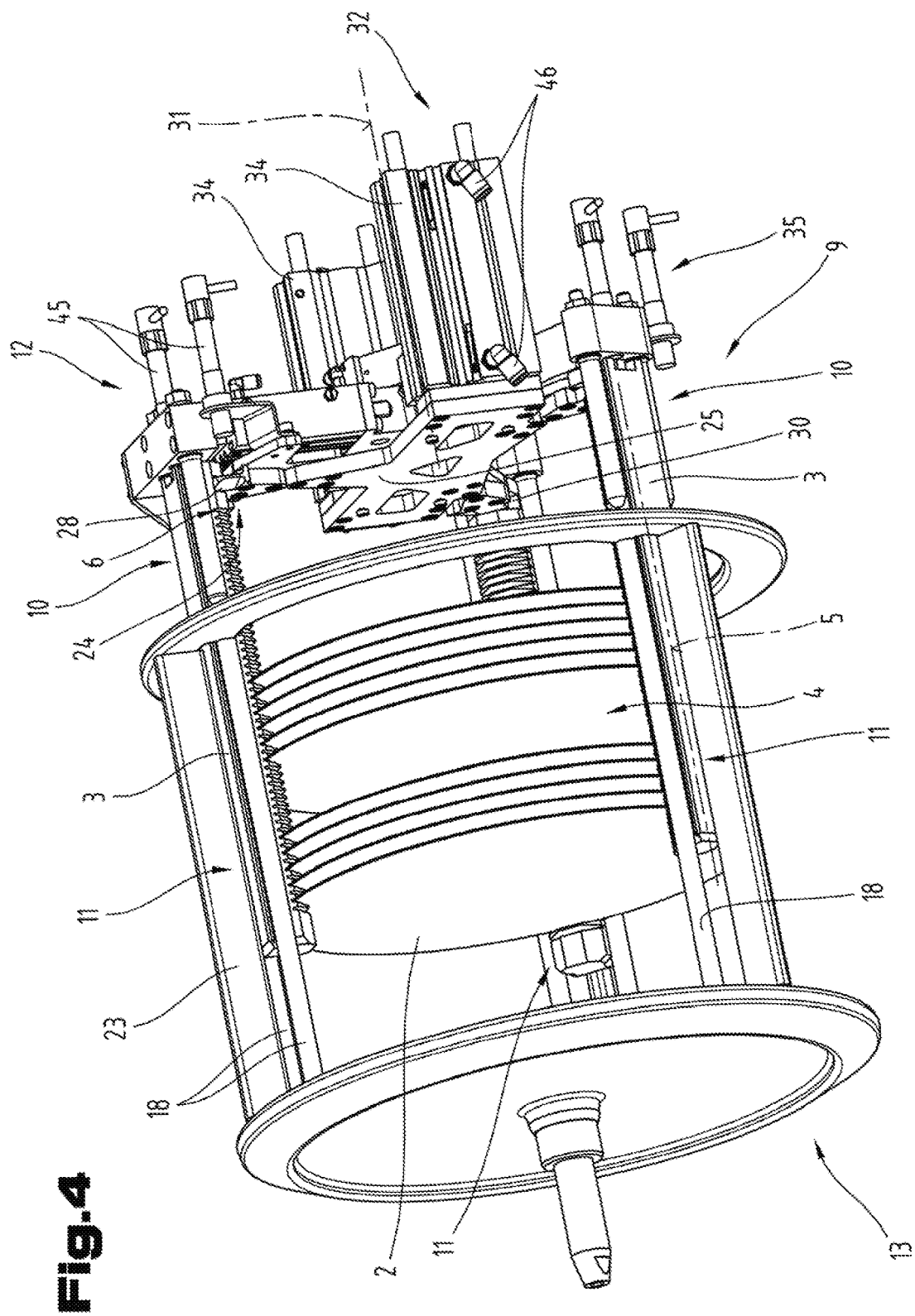
Figure 5:
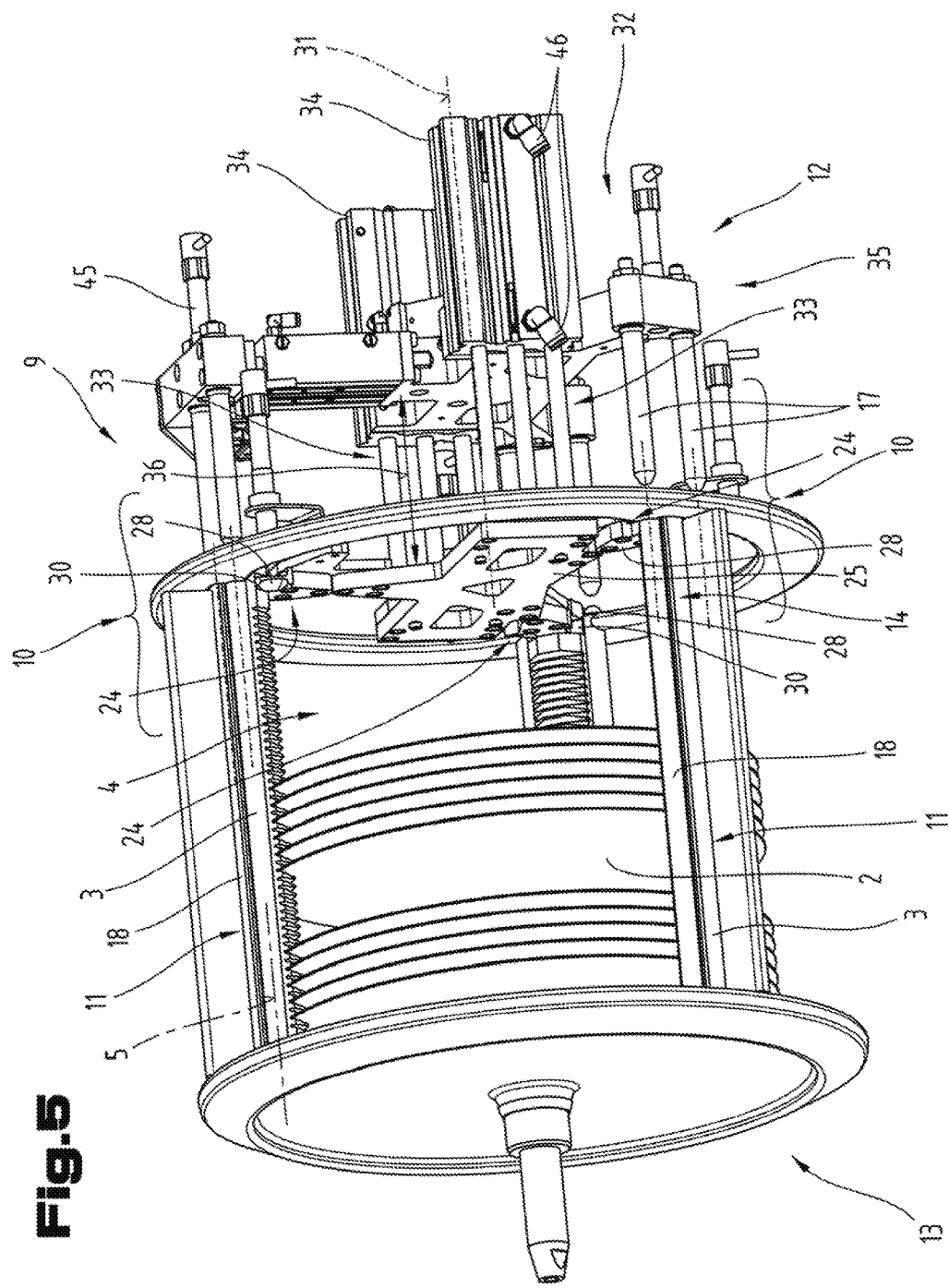
Figure 6:
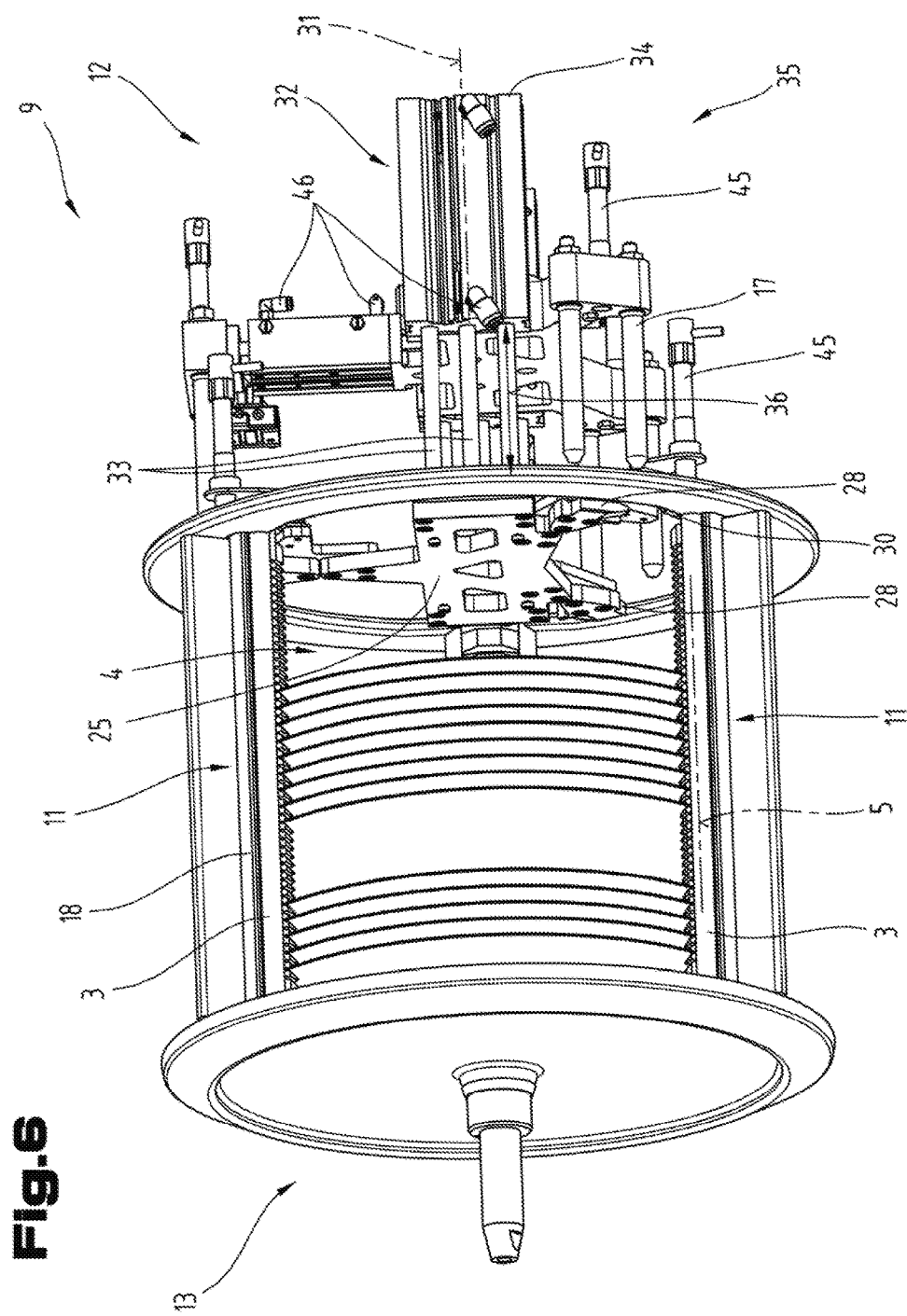
Figure 7:
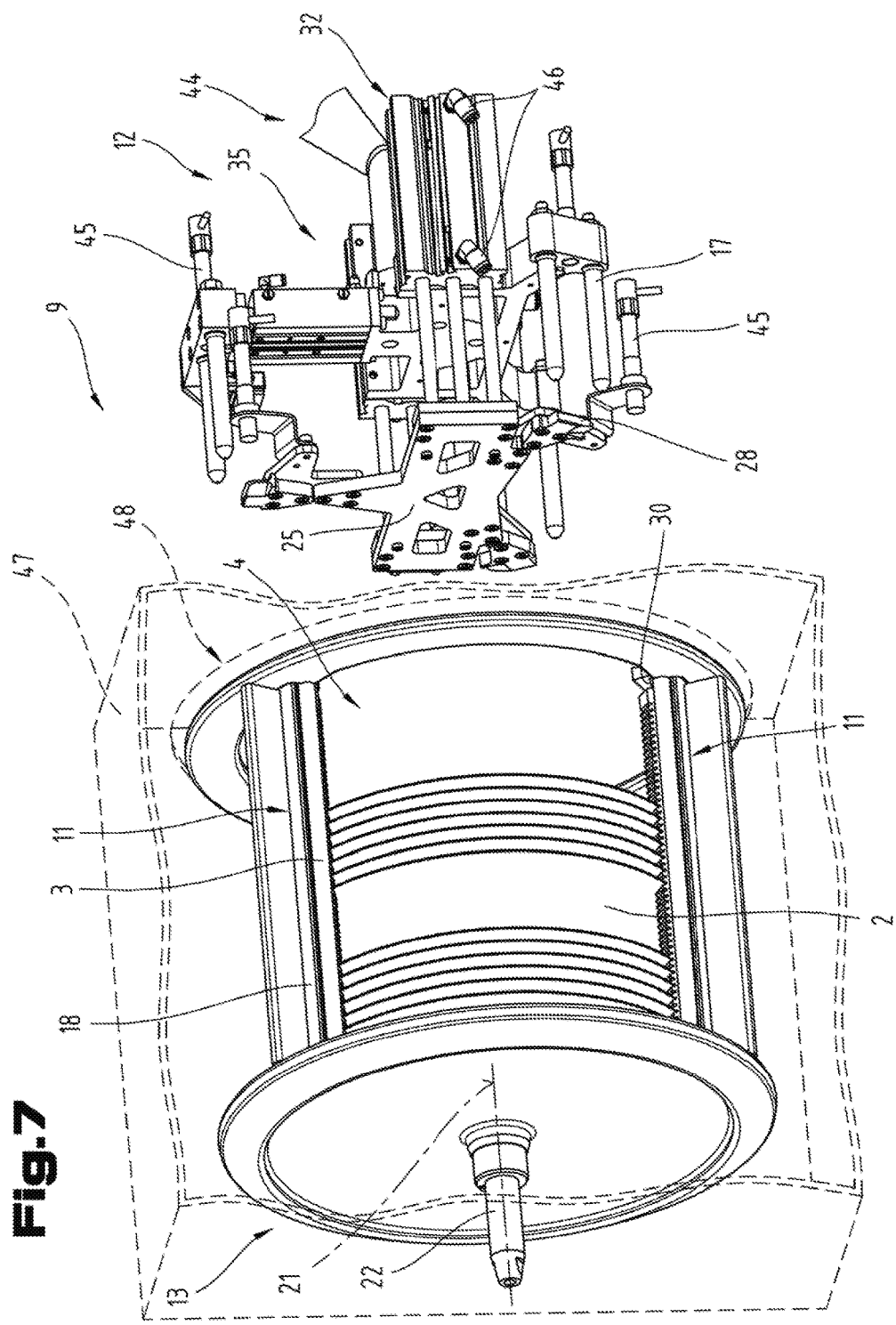
Figure 8:
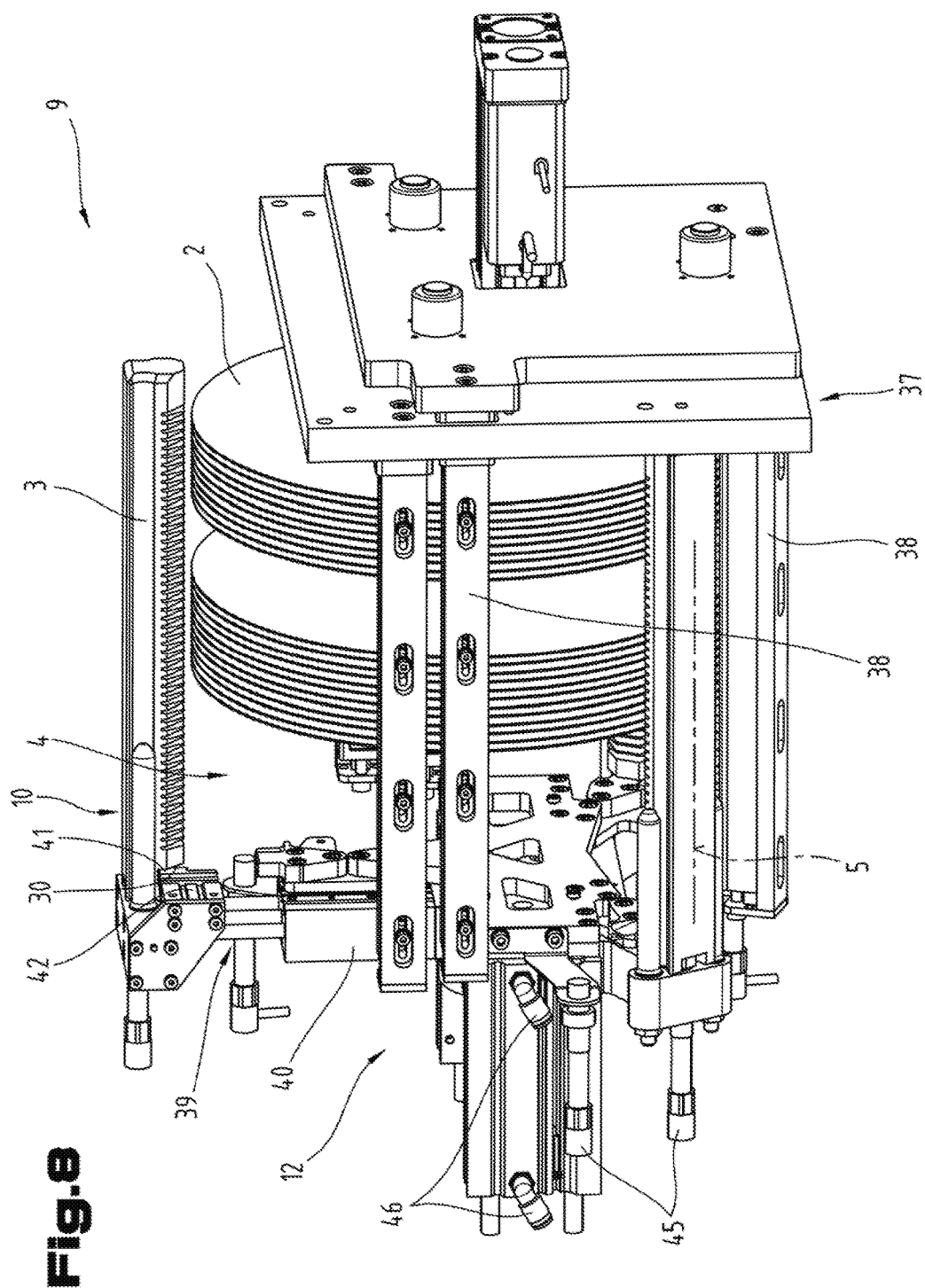
Figure 9:
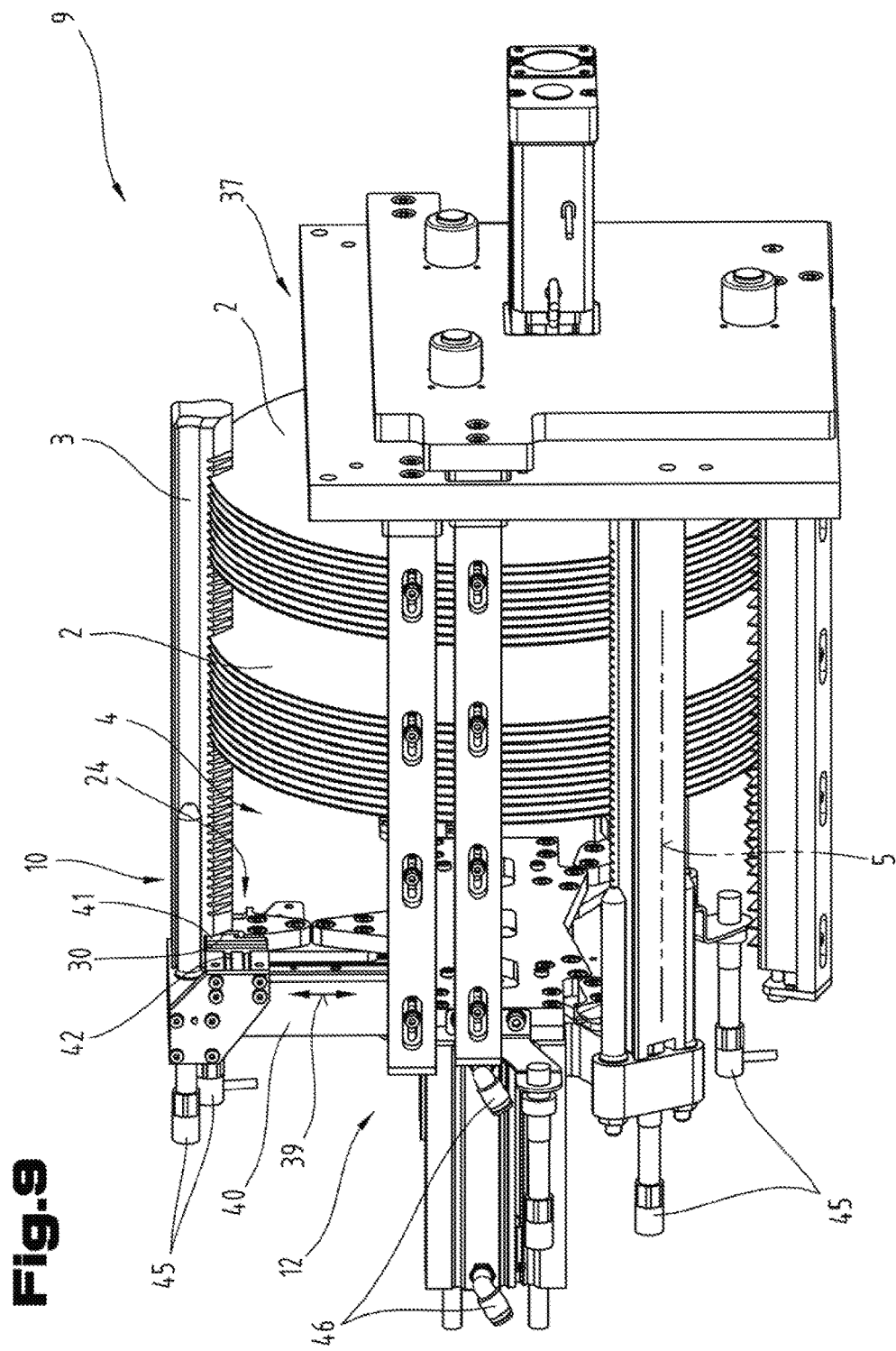

It shows, in each case in a greatly simplified, schematic representation:

FIG. 1 a mounting device according to the prior art, in a schematic, perspective representation;

FIG. 2 an exemplary embodiment for components of a mounting system according to the invention in a schematic, perspective representation with dissolved components of the mounting system;

FIG. 3 an exemplary embodiment for components of a mounting system according to the invention in a first position relative to one another, in a schematic, perspective representation;

FIG. 4 an exemplary embodiment for components of a mounting system according to the invention in a further position relative to one another, in a schematic, perspective representation;

FIG. 5 an exemplary embodiment for components of a mounting system according to the invention in a further position relative to one another, in a schematic, perspective representation;

FIG. 6 an exemplary embodiment for components of a mounting system according to the invention in a further position relative to one another, in a schematic, perspective representation;

FIG. 7 an exemplary embodiment for components of a mounting system according to the invention in a further position relative to one another, in a schematic, perspective representation;

FIG. 8 an exemplary embodiment for components of a mounting system according to the invention in a further position relative to one another, in a schematic, perspective representation;

FIG. 9 an exemplary embodiment for components of a mounting system according to the invention in a further position relative to one another, in a schematic, perspective representation;

FIG. 10 an exemplary embodiment for components of a mounting system according to the invention in a further position, in a schematic perspective representation.

By way of introduction be it noted that in the variously described embodiments same parts are provided with same reference characters or same component designations, wherein the disclosures contained throughout the description can be transferred analogously to same parts with same reference characters or same component designations. The position details such as for example top, bottom, lateral, middle etc. selected in the description are also related to the directly described and shown figure and these position details upon a position change have to be analogously transmitted to the new position. In part, for the sake of clarity, not all elements or components shown in the figures are marked with reference characters. In particular, in the case of elements or components of identical construction, one or multiple of these components are partly merely exemplarily provided with reference characters.

In FIG. 1, an example for a cylindrical mounting device 1 according to the prior art is shown perspectively. For receiving disc-shaped objects 2 the mounting device comprises retaining bars 3, wherein between the retaining bars 3 a receiving space 4 for the discs 2 is formed. In the exemplary embodiment shown in FIG. 1, the disc-shaped objects 2 can be arranged in the mounting device 1 respectively in the receiving space 4 stack-like in a position in which they are parallel to one another and spaced from one another. Such an arrangement is usual for example for the surface treatment of disc-shaped objects in spray chambers. For the stack-like arrangement of the objects 2 in the receiving space 4, each retaining bar 3 along a respective longitudinal axis 5 of the retaining bar 3 comprises support means 6. In the exemplary embodiment shown in FIG. 1, the support means 6 are formed by groove-like notches or incisions in the retaining bars 3 which are spaced from one another and arranged along the longitudinal axis. These notches are each configured for receiving an edge section of a disc-shaped object 2, as is evident from FIG. 1. In addition, the mounting device 1, for fixing the retaining bars 3 in their position relative to one another, comprises a support device which in the example shown in FIG. 1 is formed by two support rings 7, 7' which are separately attached on the holding device 1. Because of this, a structurally unitary mounting device 1 is formed, in which the disc-shaped objects 2 are held fixed in their position relative to one another.

The disc-shaped objects 2 shown in FIG. 1 are configured as round discs, wherein obviously other disc shapes or disc geometries are also possible. However, the mounting device 1 according to the prior art has to be structurally adapted to the respective shape of the disc-shaped objects 2 in this case, so that the mounting device 1 in each case is only suitable for receiving a certain geometrical configuration of the disc-shaped objects 2.

Two retaining bars 3 of the structurally unitary mounting device 1 in FIG. 1 are embodied in a manner in which they can be pivoted away from the receiving space 4 by means of pivot joins 8. Because of this, an opening for introducing and removing wafers 2 in respectively from the receiving space 4 of the mounting device 1 is created. The mounting device 1, in the closed state, can be transferred for example by a suitably configured and programmed automatic handling device between different positions for example from a provisioning position for introducing and/or removing wafers 2, into a treatment position for the wafers 2, or vice versa. The disc-shaped objects 2 and the retaining bars 3 in this case are held fixed in their position relative to one another in the respective position, for example in a treatment position or in the case of a transfer process between different positions by the support rings 7, 7' which are structurally connected to the mounting device 1. However, as already described at the outset it is disadvantageous here that through the support rings 7, 7' which are structurally formed on the mounting device 1 and the numerous braces arranged between the support rings 7, 7', certain zones in a treatment chamber become shadowed for flows or jets of a process liquid and comprehensive and uniform treatment of the disc surfaces is rendered more difficult because of this.

In FIG. 2, components of an embodiment of a mounting system 9 according to the invention are shown in perspective and dissolved representation. The mounting system 9 preferably comprises three retaining bars 3, between which a receiving space 4 for the disc-shaped objects 2 or wafers 2 is formed. Again, support means 6 are arranged on each of the three shown retaining bars 3 in FIG. 2 along a respective longitudinal axis 5 of the retaining bars 3. The support means 6 of the retaining bars 3 are formed by notches in the exemplary embodiment shown in FIG. 2, which for mounting the disc-shaped objects 2 are each in interaction with an edge section of the disc-shaped objects 2.

The support means 6 of the retaining bars 3 are configured or arranged in such a manner that a stack-like arrangement of the disc-shaped objects 2, in an arrangement in which they are parallel to one another and spaced from one another is made possible. As is further evident from FIG. 2, the three retaining bars 3 in the case of the mounting system 9 according to the invention are structurally formed independently and have no fixed connection to one another.

Obviously, in the representational form selected for FIG. 2, the component shown in FIG. 2 in the middle, comprising the three retaining bars 3 and the objects 2 arranged between the retaining bars 3, would be mechanically unstable taken on its own, since no support means for fixing the retaining bars 3 is connected to the retaining bars 3. To better understand the invention, the selected, dissolved form of representation of individual components of the mounting system 9 is nevertheless suitable since the essential aspects of the invention can be better illustrated and it is pointed out here that the representational form selected for FIG. 2 does not constitute a real state of the mounting system 9. Real cases for arrangements of the components of a mounting system 9 according to the invention are evident for example from the following FIGS. 3 to 10, in which in each case at least one support device 12, 13 for fixing the retaining bars in their position relative to one another is shown connected to the retaining bars 3.

For the purpose of mounting or fixing the arrangement of the structurally independent retaining bars 3 in their position relative to one another shown in the middle in FIG. 2, three first coupling devices 10 that are activatable and deactivatable without tools and/or three second coupling devices 11 that are activatable and deactivatable without tools are provided. By means of these first and second coupling devices 10, 11, the three retaining bars 3 in FIG. 2 can be optionally connected directly to the first support device 12 shown on the right side, or directly connected to the rotor 13 shown in FIG. 2 on the left respectively the second support device 13, or to both the first support device 12 and the rotor 13. Here, the respective connection between the components 3, 12, 13 shown in FIG. 2 via the coupling devices 10, 11 is directly disconnectable again so that the three retaining bars 3 respectively the disc-shaped objects 2 arranged between the retaining bars 3 can be introduced into the rotor 13 by means of the support device 12 or removed from the rotor 13.

If required, more than three retaining bars 3 can also be arranged, however at least two retaining bars 3 are necessary in order to position the disc-shaped objects 2 in their position relative to one another. In the case of an arrangement of only two retaining bars 3, the mounting of the disc-shaped objects 2 can be supported for example via positively joined interaction of support means 6 suitably configured on the retaining bars 3 with the edge sections of the disc-shaped objects 2. The support means 6 in this case can be at least partially adapted to the shape of the edge sections of the disc-shaped objects 2, so that an accurately fitting positive connection at least in sections between the support means 6 and the edge sections of the objects 2 is made possible. When using only two retaining bars, the two retaining bars can be positioned, during a transfer process between different positions from a suitably formed first support device and activated first coupling devices facing in the direction of the bottom, so that the disc-shaped objects are mounted by the retaining bars in a quasi supporting manner. In such a case, at least one additional support brace that is structurally arranged in the rotor or similar support device would have to be provided in the rotor for the disc-shaped objects in order to stabilise the disc-shaped objects during rotation.

In the exemplary embodiment shown in FIG. 2, the coupling devices 10 are formed by elements on the retaining bars 3 and on the first support device 12 which are configured for mutual, positively joined coupling. On the retaining bars 3, coupling sections 14 are configured. In the exemplary embodiment shown in FIG. 2, the coupling sections 14 on the retaining bars 3 are each formed by two depressions or grooves 15 on opposite lateral surfaces of the retaining bars 3. The grooves 15 are each orientated parallel to the longitudinal axis 5 of the retaining bars 3 and extend over the entire length of the retaining bars 3. Obviously it would also be possible to arrange two structurally separate coupling sections 14 on the two longitudinal ends of a retaining bar 3.

For the positively-joined coupling to the groove-shaped coupling sections 14 of the retaining bars 3, coupling elements 16 are configured on the support device 12. In the exemplary embodiment shown in FIG. 2, these coupling elements 16 are formed by two extensions or pins 17 each, which can each be connected to the two grooves 15 of a retaining bar 3 in a positively joined manner and disconnected again. By positively-joined connecting the two grooves 15 to the three retaining bars 3 with the pins 17 of the first support device 12, the three coupling devices 10 can be activated and the three retaining bars 3 connected relative to the first support device 12, as is also evident from FIG. 3. Through this positively joined connecting of the pins 17 of the first support device 12 to the grooves 15 of the retaining bars 3, the first coupling devices 10 are activated and the retaining bars 3 and the disc-shaped objects 2 are fixed by means of the first support device 12 in their position relative to one another. Because of this, due to the first coupling devices 10—on assuming their activated operating state, relative movements between the retaining bars 3 and the first support device 12 transversely to the longitudinal axis 5 of the retaining bars 3 are prevented.

Furthermore, a protective plate 43 arranged on the first support device 12 on the side facing the retaining bars 3 or a similar protective object can be formed. This protective plate 43 can for example be effective as particle protection in order to impede a transfer of contaminations from the first support device 12 to the retaining bars 3 or the objects 2 and vice versa. For the sake of clarity and for the purpose of better illustration, such a protective screen 43 is not shown in FIGS. 3 to 10.

As is shown in FIG. 3, the positively joined engagement of the pins 17 with the grooves 15 of the retaining bars 3 takes place on one side, approximately over a third of the entire longitudinal extension of the retaining bars 3, so that the retaining bars 3 during the course of a transfer process of the disc-shaped objects 2 are spatially fixed by means of a single first support device 12 in such a manner that they project from the first support device 12 in the manner of unilaterally supported beams. Because of this, the retaining bars 3, with activated first coupling devices 10, can be simultaneously connected also to further support devices, for example to the rotor 13 shown in FIGS. 2 to 7.

The three coupling devices 11 in FIG. 2, for connecting the retaining bars 3 to the rotor 13, are similarly configured as the three coupling devices 10 for connecting the retaining bars 3 to the first support device 12. The second support device respectively the rotor 13 shown in FIG. 2 comprises coupling elements 16, which are configured for the positively joined interaction with the grooves 15 of the retaining bars 3. In the case of the rotor 13 shown in FIG. 2 on the left side, the coupling elements 16 are designed as holding braces 18. The holding braces 18 extend between a head element 19 of the rotor 13 and a ring element 20 that is arranged on the side of the rotor 13 located opposite the head element 19. The longitudinal extensions of the holding braces 18 of the rotor 13, in the exemplary embodiment shown in FIG. 2, correspond at least largely to the longitudinal extensions of the retaining bars 3. Because of this, the retaining bars 3, with respect to their longitudinal extension, can be completely introduced into the rotor 13 as is evident in particular from FIGS. 5 to 7. By positively connecting the grooves 15 of the three retaining bars 3 in FIG. 2 to the holding braces 18 of the rotor 13, the second coupling devices 11 can be activated and the retaining bars 3 and the objects 2 or wafers 2 which are arranged between the retaining bars 3 are fixed in the rotor 13 in their position relative to one another.

It should thus be noted that the retaining bars 3 in the state in which they are inserted or slid into the rotor 13, that is in the activated state of the second coupling devices 11, are mounted, with respect to a plane running transversely to the longitudinal axis 5 of the retaining bars 3, free of play or substantially free of play relative to the rotor 13, in particular relative to the holding braces 18 of the same. Compared with this, the retaining bars 3, in parallel direction to the longitudinal axis 5 of the retaining bars 3 in the state in which they are inserted in the rotor 13, are held positioned in principle relatively moveable with respect to the rotor 13 and preferentially held positioned in the rotor 13 merely by the effect of gravity and/or frictional connection.

The rotor 13 shown in FIGS. 2 to 7 is usually arranged in a treatment chamber 47 or a similar device for the purpose of treatment of the disc-shaped objects 2 or the surfaces of the objects 2, wherein such a treatment chamber for the sake of clarity is merely shown in FIG. 7. Such a treatment chamber 47 usually comprises means for feeding in gaseous and/or liquid chemicals such as for example a treatment liquid or the like. For example, outlets or openings in the manner of spray nozzles can be arranged on the interior walls of a treatment chamber 47, by means of which spray nozzles a treatment liquid can be conducted in the direction of the surfaces of the disc-shaped objects 2, in order to chemically treat the surfaces of the objects 2. For charging such a treatment chamber 47 with a plurality of disc-shaped objects 2 to be treated, a treatment chamber 47 usually comprises a charge opening 48, which can be arranged at an axial end of an axis of rotation 21 of the rotor 13.

As already explained at the outset, a substantial advantage of the present invention is obtained in that because of the optionally connectable and disconnectable coupling devices 10, 11 the retaining bars 3 can be formed structurally independently. Because of this, the support elements that are usual in the prior art such as for example longitudinal and transverse braces, support plates or support rings and the like are no longer required, so that the number of volume regions in the chamber, which are not accessible at all to a flow or jet of the treatment liquid or only with difficulty so, is at least minimised. By means of the second coupling device 11, the retaining bars 3 can be connected to the rotor 13 and the retaining bars 3 respectively the disc-shaped objects 2 are fixed by the rotor 13 respectively the second support device 13 in the treatment chamber in their position relative to one another.

On the head element 19 of the rotor 13, on the side of the head element 19 facing away from the ring element 20, a connecting piece 22 is arranged, which connecting piece 22 can be directly or indirectly connected to a drive element (not shown) for rotating the rotor 13 in a treatment chamber. In the exemplary configuration shown in FIGS. 2 to 7, the rotor 13 additionally comprises three additional support braces 23, which, each radially offset to the outside relative to the holding braces 18, are arranged in the region of the holding braces 18. These support braces 23 improve, above all, the stability of the arrangement of the retaining bars 3 and of the disc-shaped objects 2 in the rotor 13 while the rotor 13 is rotating. The rotation of the disc-shaped objects 2 during a treatment in a treatment chamber in this case can take place about an axis of rotation 21, which runs through the center of the disc-shaped objects 2. Through the preferred embodiment of the second coupling devices 11 which is evident for example from FIGS. 4 to 7, a twisting of the retaining bars 3 about their longitudinal axes 5 is effectively prevented, in particular even when the rotor 13 is put into rotary motion.

As is illustrated for example in FIG. 2, the spatial arrangement of the three retaining bars 3 in their position relative to one another is substantially determined by the arrangement of the pins 17 on the first support device 12 respectively by the arrangement of the holding braces 18 of the rotor 13. This is also evident from the real positioning examples shown in FIGS. 3 to 7. Preferably, the retaining bars 3 are positioned about the receiving space 14 for the disc-shaped objects 2 in such a manner that an angle assumed between adjacent retaining bars 3 amounts to approximately 120° each. Other arrangement variants are also possible, however an acute angle taken up between adjacent retaining bars 3 should be at least equal or smaller than 180°.

Alternatively to the exemplary embodiment shown in FIGS. 2 to 10, other configuration variants for configuring the coupling devices 10, 11 are obviously also conceivable. For example, the coupling sections 14 of the retaining bars 3 can be formed by bores in the direction of the longitudinal axis 5 of the retaining bars 3 made in the or through the retaining bars 3. Such bores in turn can be formed for positive interaction with extensions or pins on the first support device 12.

In principle, entirely different configured coupling devices 10, 11 are also possible. For example, the activation of a coupling device 10, 11 according to the invention for coupling the retaining bars 3 to the support devices 12, 13 can also be achieved by way of frictional connection. Here, a frictional connection can be configured combined with a positive connection. For example, activation of a coupling device 10, 11 according to the invention can be achieved through a clamping action between the retaining bars 3 and the support devices 12, 13. To this end, mutually effective snap and/or engagement elements and the like can be employed for example. Further configuration variants can for example be realised through activatable and deactivatable non-positive interactions for example of a magnetic nature or by means of suction devices on the support devices or other suitable devices. In principle, the exact type of the configuration of the coupling devices 10, 11 can be determined by a person skilled in this technical area with the help of the prior and future state of the art.

In the following, further advantageous features of configuration examples of the mounting system 9 according to the invention are described by way of FIGS. 3 to 10. By sequentially viewing FIGS. 3 to 7 together in this sequence, a transfer process for charging the rotor 13 with the disc-shaped objects 2 is also illustrated. By reversing the viewing sequence of FIGS. 3 to 7, that is sequentially viewing FIGS. 7, 6, 5, 4 and 3 in this sequence, a transfer process for removing the objects 2 from the rotor 13 by means of the first support device 12 is also evident. Deactivated first coupling devices 10 and deactivated second coupling devices 11 are each shown in the figures by means of dash-dotted lines and a curly bracket, the curly brackets being indicated by arrows and the reference numbers 10 and 11 respectively. Activated first coupling devices 10 and activated second coupling devices 11 are each provided with arrows and the reference numbers 10 and 11 respectively.

As is evident by sequentially viewing FIGS. 3 to 7 together, the respective three first and second coupling devices 10, 11 can be configured in such a manner that a coupling movement for connecting the retaining bars 3 to the first and the second support device 12, 13, and a disconnecting movement for disconnecting the retaining bars 3 from the first and the second support device 12, 13 can be carried out parallel to the longitudinal axis 5 of the retaining bars 3.

In FIG. 3, the retaining bars 3 are merely shown connected to the first support device 12. The disc-shaped objects 2 or wafers 2, or the retaining bars 3 and the wafers 2, can have been removed beforehand by means of the first support device 12 for example from a provisioning device or another treatment device. FIG. 4 illustrates the coupling process of the retaining bars 3 to the second support device 13, in particular the rotor 13. Here, the three first and three second coupling devices 10, 11 are at least briefly activated, so that the retaining bars 3 are connected both to the first support device 12 and also to the rotor 13. The transfer process is finally terminated by disconnecting the mechanical connection between the first support device 12 and the retaining bars 3 or deactivating the first coupling devices 10, and removing the first support device 12 from the rotor 13 or from the retaining bars 3, as is illustrated in FIGS. 5 to 7. For disconnecting and removing the retaining bars 3 from the first support device 12, further adjusting processes by further actuating elements of the first support device 12 are shown here in the exemplary embodiment shown in FIGS. 5 and 6. These adjusting processes respectively actuating elements will still be explained in more detail in the following.

Finally—as shown in FIG. 7—the disc-shaped objects 2 or wafers 2 are held between the three retaining bars 3 which are arranged evenly distributed over the rotational circumference of the rotor 13, or a positive connection between the retaining bars 3 and the rotor 3 is established by means of the three second coupling devices 11. The retaining bars 3 are positively held at the respective desired positions on the rotational circumference of the rotor 13 exclusively by the second coupling devices 11. This means that when the disc-shaped objects 2 assume the treatment position the first coupling devices 10 are disconnected and the first support device 12 removed from the retaining bars 3, while the second coupling devices 11 between the retaining bars 3 and the second support device 13 respectively the rotor 13 for rotating the disc-shaped object 2, are activated.

Following a completed treatment process, the disc-shaped objects 2 respectively retaining bars 3 can then be again removed from the rotor 13 by means of the first support device 12 and for example transferred into a provisioning position respectively placed in a provisioning device. By reversing the sequential viewing of FIGS. 7 to 3, i.e. by looking at FIG. 7, 6, 5, 4, 3 in this sequence, this process becomes evident. Such a process can be carried out without problem by way of the above description by a skilled person active in this field, which is why a thorough description can be omitted at this point.

In principle, the first support device 12 can be formed for a transfer process of the disc-shaped objects 2 between different provisioning and treatment positions for manual handling by an operating person but also for the automated handling by an automated handling device such as for example an industrial robot. A part or a final actuator of such an industrial robot is shown in FIGS. 7 and 10, whereas in FIGS. 3 to 6 and FIGS. 8 to 9 the representation of the industrial robot 44 is omitted for the sake of clarity. In particular, the first support device 12 can comprise a connecting interface to an industrial robot, so that the first support device 12 acts as end effector of the industrial robot 44. Such industrial robots 44 are usually designed programmable, wherein the selection and the programming of an industrial robot for handling a first support device 12 can be performed by a skilled person active in this field based on the current and future prior art.

Alternatively and/or additionally, the first support device 12 for manual operation by an operating person comprise for example handles (not shown) for manually gripping the first support device 12. In addition, further handles (not shown) for manually handling the first support device 12 can be provided, by means of which handles various additional devices or additional functions of the first support device 12 or of the first coupling devices 10 can be manually operated or carried out. Such additional devices of the first support device 12 or of the first coupling devices 10 are now explained in more detail in the following.

Preferentially, between the first support device 12 and at least one retaining bar 3, at least one further optionally activatable and deactivatable coupling device 24 is formed, by means of which at least one retaining bar 3 can be optionally coupled to a coupling element 25 of the first support device 12 and disconnected from the coupling element 25. Because of this, relative movements between the retaining bars 3 and the coupling element 25 in parallel direction to the longitudinal axis 5 of the retaining bars 3 can be optionally disabled and enabled. Through at least one such additional coupling device 24, for example unintentional or inadvertent disconnecting of the first coupling devices 10 during the course of a transfer process for the disc-shaped objects 2, and thus a sliding down of the retaining bars 3 from the first support device 12 can be prevented. In particular with a purely positively joined design of the first coupling devices 10, such sliding-down cannot be excluded for example when during the course of the transfer process the longitudinal end of the retaining bars 3 facing away from the first support device 12 is inclined in the direction of the ground. In order to prevent unintentional sliding-down of the retaining bars 3 from the first support device 12 an additional coupling device 24 would be basically adequate since the other retaining bars, via the activated first coupling devices 10, are fixed in their position relative to one another.

For the purpose of improving the stability, preferably three coupling devices 24 are formed, as is also shown in the exemplary embodiment according to the FIGS. 3 to 10. The coupling devices 24 are formed on the retaining bars 3 and on the coupling element 25 through elements that are configured for mutual, positive coupling. The coupling element 25 in this case is structurally assigned to the first support device 12. As is best evident from FIG. 3, the coupling element 25 can be formed by a star-like arrangement with three arms 26, which arms 26, substantially originating from the center point of the coupling element 25, extend in radial direction towards the retaining bars 3. On the respective ends of the three arms 26 of the coupling element 25 located radially outside, three locking elements 27 can be arranged, which can be brought into positive engagement with the retaining bars 3. To this end, the locking elements can be formed by locking extensions 28 on the ends of the arms 26 of the coupling element 25 and these locking extensions 28 can be formed for the positive interaction with locking means 29 of the three retaining bars 3. In the shown exemplary embodiment, the locking means 29 are formed by locking grooves 30 which are arranged on a longitudinal end of the retaining bars 3 facing the first support device 12 and are formed for positively receiving the locking extensions 28 of the coupling element 25.

Alternatively to the exemplary embodiment shown in the figures, other configuration variants of the at least one additional coupling device 24 are obviously also conceivable. For example, the locking extensions 28 of the coupling element 25 can also be designed for interaction with a support means 6 that is arranged on a longitudinal end of the retaining bars 3 facing the first support device 12. In principle, a coupling device 24 can also be embodied activatable through frictional coupling of the retaining bars 3 and of the coupling element 25 of the first support device 12, wherein positive and frictional couplings combined are also conceivable. For example, clamping elements can be arranged on the first support device 12 in pairs, which can be designed for engaging behind a retaining bar 3. Other types of mutually interacting snap or engagement elements on the retaining bars 3 and the first support device 12 are generally also employable. For example, a coupling device 24 could also be designed in such a manner that on a coupling element 25 activatable and deactivatable suction devices are arranged, by means of which suction devices a retaining bar 3 on one of their longitudinal ends can be coupled to the suction device. Such a suction device in this case can be connected to a vacuum pump or the like that can be switched on and switched off so that the coupling device 24 in turn is optionally activateable and deactivateable. Other types of deactivatable and activatable non-positive couplings are obviously also conceivable. The exact type of the configuration of a coupling device 24 can be performed by a skilled person active in this field according to the current and future state of the art, depending on the specific requirements.

In the exemplary embodiment shown in FIGS. 2 to 10, the three coupling devices 24 can be optionally activated or deactivated by pivoting the first support device 12 about an axis 31 which runs parallel to the longitudinal axis 5 of the retaining bars 3 and substantially through the centre of the first support device 12. This is best evident by viewing FIGS. 5 and 6 together. The relative adjustment between the first support device 12 and the retaining bars 3 in parallel direction to the longitudinal axis 5 of the retaining bars 3 that is evident by viewing FIGS. 4 and 5 together will still be explained in detail in the following.

In FIGS. 3 to 5, the locking extensions 28 of the coupling elements 25 are shown in positive interaction with the locking grooves 30 of the retaining bars 3, whereby a relative adjustment between the retaining bars 3 and the coupling element 25 in the direction of the longitudinal axis 5 of the retaining bars 3 is prevented. As is shown in FIG. 6, the locking extensions 28 and locking grooves 30 can be set out of engagement by pivoting the first support device 12 about the axis 31 so that the coupling devices 24 are deactivated. The pivoting of the first support device 12 about the axis 31 can then be carried out for example by means of an industrial robot 44 or by an operating person. The coupling devices 10 are already shown deactivated in FIG. 5, which is why following deactivation of the coupling devices 24—see FIG. 6—the first support device 12 can be removed from the retaining bars 3 in the rotor 13, as is shown in FIG. 7.

Alternatively to the shown exemplary embodiment, the coupling element 25 can also be pivotably mounted about the axis 31 on the first support device 12 (not shown). This embodiment variant can be advantageous for manual operation of the first support device 12 by an operating person. Here, the coupling element 25 for deactivating the coupling devices 24 has to be pivotably mounted on the first support device 12 at least so far that in turn the locking extensions 28 and the locking grooves 30 can be set out of engagement. The manual pivoting of the coupling element 25 by the operating person can for example take place by means of a pivot element or a pivot rod that is connected to the coupling element 25.

On the first support device 12, at least one actuating device 32 is preferably arranged, by means of which a relative adjustment between the first support device 12 and the retaining bars 3 in parallel direction to the longitudinal axis 5 of the retaining bars 3 is made possible. On the embodiment version of the support device 12 shown in FIGS. 3 to 10, two actuating devices 32 are arranged, which in particular comprise two guide devices 33 which run parallel to the longitudinal axis 5 of the retaining bars 3. In the shown exemplary embodiment, the two actuating devices 32 additionally comprise an actuating drive each, which actuating drives are formed as pneumatic actuating cylinders 34. For actuating the pneumatic actuating cylinders 34, these can for example be line-connected for example via reinforced pressure and/or vacuum hoses or the like to a switchable compressed-air source and/or a suction device. Alternatively to the shown pneumatic actuating cylinders 34, other drive elements, such as for example electrical or magnetic drive elements, motors and the like or manual actuation of the actuating devices 32, would obviously be also possible.

Preferably, the guide devices 33 of the actuating device 32 are connected, as shown in the exemplary embodiment, to the coupling element 25 respectively to two of the three arms 26 of the coupling element 25. Thus, the coupling element 25, by means of the actuating device 32, is embodied adjustable in parallel direction to the longitudinal axis 5 of the retaining bars 3 relative to a support body 35 of the first support device 12, as is best evident by viewing FIGS. 4 and 5 together. In FIGS. 4 and 5, the coupling devices 24 between the three retaining bars 3 and the coupling element 25 are activated so that during an adjusting process by means of the actuating device 32, the three retaining bars 3 are also adjustable in parallel direction to the longitudinal axis 5 of the retaining bars 3 relative to the support body 35 of the first support device 12. Here, the coupling element 25 is effective as driver for the retaining bars 3.

Alternatively to the shown exemplary embodiment, guide means, which are structurally arranged separately from the coupling element 25, would also be conceivable for adjusting the retaining bars 3 relative to the first support device 12 (not shown). To this end, further coupling devices for coupling the retaining bars 3 to such guide means would have to be provided, so that the retaining bar 3 in turn could only be adjustable by means of one or multiple actuating devices 32 in parallel direction to the longitudinal axis 5 of the retaining bars 3 relative to the support body 35 of the first support device 12.

Independently of this, an available adjusting travel 36 of the actuating device 32 is preferably selected or dimensioned in such a manner that the three first coupling devices 10 are optionally activatable and deactivatable by means of the actuating device 32, as is best evident by viewing FIGS. 4 and 5 together. Both in FIG. 4 and also FIG. 5, the coupling devices 24 between the retaining bars 3 and the coupling element 25 are activated. In the position shown in FIG. 4, the coupling element 25 is substantially positioned by means of the actuating device 32 on the support body 35 of the first support device 12. Because of this, the three first coupling devices 10 are positively activated. In the position shown in FIG. 5, the coupling element 25 is relatively positioned distanced from the support body 35 of the first support device 12 by the adjusting travel 36 by means of the actuating device 32—compared with the position in FIG. 4. Because of this, the three first coupling devices 10 are deactivatable, respectively the coupling sections 14 of the retaining bars 3 and the pins 17 of the first support device 12 can be set out of engagement. In particular, the retaining bars 3 respectively the disc-shaped objects 2 can also be completely introduced into the second support device 13 or the rotor 13 in this way, as is evident in particular in FIG. 5.

A further embodiment of the mounting system 9 which is independent if appropriate is shown in FIGS. 8 to 10, wherein in turn same reference characters or component designations as in the preceding FIGS. 2 to 7 are used for same parts. In order to avoid unnecessary repetitions, reference is made to the detailed description in the preceding FIGS. 2 to 7. In FIGS. 8 to 10, a process for removing a stack-like arrangement of disc-shaped objects 2 from a provisioning device 37 by means of the first support device 12 is evident when viewed sequentially. The provisioning device 37 in the shown exemplary embodiment comprises multiple holding pins 38, between which the disc-shaped objects 2 or wafers 2 are provided stack-like. The holding pins 38 for the stack-like mounting of the wafers 2 can be substantially configured analogously to the retaining bars 3 described at the outset, which is why a repeated description of the elements of the holding pins 38 for mounting the wafers 2 is omitted at this point.

As is shown for example in FIG. 8, at least one of the coupling devices 10 can be assigned a linear guide 39 or for example a pivot mounting (not shown) or the like. The purpose of the linear guide 39 can be that at least one retaining bar 3 can be optionally removed from the receiving space 4 for the disc-shaped objects 2 and brought close to the receiving space 4. In FIG. 8, a retaining bar 3 with activated coupling device 10 is shown removed from the receiving space 4 for the disc-shaped objects 2 via the linear guide 39 assigned to this coupling device 10. Because of this it is made possible that the retaining bars 3 by means of the first support device 12 can be positioned about the objects 2 that are arranged in the provisioning device 37 as is evident by way of FIG. 8.

Alternatively to the shown exemplary embodiment with the version of a linear guide 39, other adjusting arrangements for the optional removing of a retaining bar 3 from the receiving space 4 or bringing a retaining bar 3 closer to the receiving space 4 would obviously be also conceivable. For manual operation by an operating person, for example, a pivot mounting (not shown) if applicable would be better suitable or easier to operate. Such a pivot mounting in this case can be formed for example by a pivot joint formed on the first support device 12 so that a retaining bar 3 can be adjustable away or pivotable away from the receiving space 4 to the outside. Alternatively a folding away and folding towards a retaining bar 3 from or to the receiving space 4 would also be conceivable, in the case of which a retaining bar 3 is pivotably mounted on the first support device 12 (not shown) for example about an axis of rotation running transversely to the longitudinal axis 5 of the retaining bars 3.

The linear guide 39 shown in FIGS. 8 to 10 can be designed for the automated removing of a retaining bar 3 from the receiving space 4 respectively automated bringing closer of a retaining bar 3 to the receiving space 4. As is evident from FIGS. 8 to 10, the linear guide 39 can be assigned an actuating drive, in particular in turn a pneumatic actuating cylinder 40 for the relative adjustment of a retaining bar 3 relative to the receiving space 4. In FIG. 8, one of the three retaining bars 3 is shown removed from the receiving space 4 by means of the linear guide 39 respectively the pneumatic actuating cylinder 40. In this position of the one retaining bar 3, the retaining bars 3 can be positioned about the objects 2 arranged in the provisioning device 37 by means of the first support device 12. As is likewise evident from FIG. 8, it can be practical in this case to assign an additional axial locking means 41 at least to the one adjustable retaining bar 3. The additional axial locking means 41 shown in FIG. 8 in this case is again adjustable on the first support device 12, and can optionally be positively connected to the locking groove 30 of the retaining bar 3 as is shown for example in FIG. 8 or be removed from the locking groove 30. Through the additional axial locking means 41, optional disabling and enabling of relative movements between this retaining bar 3 and the first support device 12 in parallel direction to the longitudinal axis 5 of this retaining bar 3 is also made possible even with a retaining bar 3 that is removed from the receiving space 4. Adjusting the additional axial locking means 41 can again take place for example with a pneumatic actuating cylinder 42. For disconnecting the retaining bars 3 from the first support device 12, for example for concluding a charging process in a rotor 13 by removing the first support device 12 from the retaining bars 3, the axial locking means 41 can be removed from the locking groove 30 by means of the pneumatic actuating cylinder 12.

By bringing the one adjustable retaining bar 3 close to the receiving space 4, the disc-shaped objects 2 can be received between the retaining bars 3 and the objects 2 are mounted stack-like between the retaining bars 3 as is shown in FIG. 9. With activated first coupling devices 10 and activated coupling devices 24, the retaining bars 3 and the objects 2 are fixed in their respective position relative to one another by means of the first support device 12. Accordingly, the disc-shaped objects 2 can be removed from the provisioning device 37 by means of the first support device 12 as is shown in FIG. 10. Following this, a transfer process can take place by means of the first support device 12, for example a charging process for a rotor, as is evident by sequentially viewing FIGS. 3 to 7 together.

A process for placing down disc-shaped objects 2 in the provisioning device 37, for example following a completed treatment process for the disc-shaped objects 2, is clearly evident in turn by sequentially viewing FIGS. 10 to 8, that is viewing FIG. 10, 9, 8 in this sequence. Following this removal of the disc-shaped objects 2 or retaining bars 3, for example from the rotor 13 shown in FIGS. 7 to 3, the objects 2 or wafers 2 can be put down or intermediate-stored in the provisioning device 37 by means of the linear guide 39 respectively the actuating cylinder 40 and concluding removal of the first support device 12 respectively of the retaining bars 3 from the provisioning device 37 by means of the industrial robot 44.

Finally it should be noted that in particular for automated transfer processes by means of an industrial robot 44, sensors 45 can be assigned to the first support device 12. Such sensors 45 in this case are designed for example for detecting if the retaining bars 3 are connected to the first support device 12, that is if the first coupling devices 10 are activated. In addition, further sensors 45 can be arranged on the first support device 12, which monitor the state of the coupling devices 24 i.e. which are designed for detecting if the coupling devices are activated or deactivated. Here, the sensors 45 can be formed for example by capacitive sensors 45 in the manner of capacitive proximity sensors, whereby a retaining bar 3 approaching or leaving the sensor 45 is detectable. The type, quantity and arrangement of sensors 45 in each case is obtained from the relevant configuration of the first support device 12 and can be selected or performed by a person skilled in this field by way of the respective requirements.

Finally, some connections 46 for actuating or activating the activation cylinders 34, 40, 42 are exemplarily marked with the reference number 46 in the figures. These connections 46 can for example be connected to a source of compressed air, such as for example a compressor, or a vacuum source, for example a vacuum pump, by way of pressure or vacuum hoses or the like.

The exemplary embodiments show possible embodiment versions of the mounting system respectively the method for charging a treatment device, wherein it is pointed out here that the invention is not restricted to the specifically shown embodiment versions of the same, but that various combinations of the individual embodiment versions among them and this variation possibility because of the teaching for technical action through the present invention is within the ability of the person skilled in this technical field.

Furthermore, individual features or feature combinations from the different exemplary embodiments shown and described can constitute solutions that are independent, inventive or in accordance with the invention.

The object on which the independent inventive solutions are based can be taken from the description.

All details regarding value ranges in the present description must be understood so that these also comprise any and all part regions thereof, for example the specification 1 to 10 is to mean that all part regions, starting out from the lower limit 1 and the upper limit 10 are thereby included, i.e. all part ranges beginning with a lower limit of 1 or greater and end at an upper limit of 10 or less, for example 1 to 1.7, or 3.2 to 8.1, or 5.5 to 10.

Above all, the individual embodiments shown in FIGS. 2 to 10 can form the subject of independent solutions according to the invention. The objects and solutions in accordance with the invention in this regard can be taken from the detail description of these figures.

As a matter of form, it is pointed out in concluding that to better understand the construction of the mounting system its components were in part shown not to scale and/or enlarged and/or reduced in size.

| List of reference numbers | |
|---|---|
| 1 | Mounting device |
| 2 | Object |
| 3 | Retaining bar |

-continued

List of reference numbers

| | |
|---|---|
| 4 | Receiving strip |
| 5 | Longitudinal axis |
| 6 | Support means |
| 7 | Support ring |
| 8 | Pivot joint |
| 9 | Mounting system |
| 10 | Coupling device |
| 11 | Coupling device |
| 12 | Support device |
| 13 | Rotor |
| 14 | Coupling section |
| 15 | Groove |
| 16 | Coupling element |
| 17 | Pin |
| 18 | Holding brace |
| 19 | Head element |
| 20 | Ring element |
| 21 | Axis of rotation |
| 22 | Connecting piece |
| 23 | Support braces |
| 24 | Coupling device |
| 25 | Coupling element |
| 26 | Arm |
| 27 | Locking element |
| 28 | Locking extension |
| 29 | Locking means |
| 30 | Locking groove |
| 31 | Axis |
| 32 | Actuating device |
| 33 | Guide device |
| 34 | Actuating cylinder |
| 35 | Support body |
| 36 | Adjusting travel |
| 37 | Provisioning device |
| 38 | Holding pin |
| 39 | Linear guide |
| 40 | Actuating cylinder |
| 41 | Axial locking means |
| 42 | Actuating cylinder |
| 43 | Protective plate |
| 44 | Industrial robot |
| 45 | Sensor |
| 46 | Connection |
| 47 | Treatment chamber |
| 48 | Charge opening |

The invention claimed is:

1. A mounting system for mounting disc-shaped objects in a provisioning position or in a treatment position for treating the surfaces of the disc-shaped objects, and for mounting the disc-shaped objects during a transfer process between the provisioning position and the treatment position, between different provisioning positions, or between different treatment positions, the mounting system comprising:
at least first and second retaining bars comprising first and second longitudinal axes, respectively, and first and second supports, respectively, for stacked mounting of the disc-shaped objects in an arrangement wherein the disc-shaped objects are parallel to and spaced from one another, wherein the disc-shaped objects have edge sections and the first and second supports are adapted to be in interaction with the edge sections of the disc-shaped objects;
a receiving space for the disc-shaped objects between the first and second retaining bars;
at least a first support device for fixing the first and second retaining bars in a position relative to one another; and
at least two first coupling devices for connecting and disconnecting the first and second retaining bars with the first support device;
wherein the first and second retaining bars are structurally independent of one another.

2. The mounting system according to claim 1, further comprising
(a) a second support device and
(b) at least two second coupling devices for connecting and disconnecting the first and second retaining bars with the second support device.

3. The mounting system according claim 2, wherein in the treatment position of the disc-shaped objects, the first support device is disconnected from the first and second retaining bars and the first and second retaining bars are connected with the second support device.

4. The mounting system according to claim 2, wherein the at least two second coupling devices are adapted so that twisting of the first and second retaining bars about the first and second longitudinal axes, respectively, is prevented.

5. The mounting system according to claim 2, wherein the first and second retaining bars comprise at least first and second coupling sections, respectively, and
wherein each of the first and second coupling sections is adapted to be positively coupled, respectively, with at least one coupling element of the first or second support device.

6. The mounting system according to claim 5, wherein the first and second coupling sections of the first and second retaining bars comprise at least first and second depressions, respectively, adapted to positively connect, respectively, with at least one extension of the first or the second support device.

7. The mounting system according to claim 2, wherein the at least two first and the at least two second coupling devices are configured so that a coupling movement for connecting the first and second retaining bars to the first support device and the second support device, and a disconnecting movement for disconnecting the first and second retaining bars from the first support device and the second support device, can be carried out parallel to the first and second longitudinal axes of the first and second retaining bars.

8. The mounting system according to claim 2, further comprising a treatment chamber, wherein the second support device comprises a rotor for rotating the disc-shaped objects, wherein the rotor arranged in the treatment chamber, and wherein the treatment chamber comprises at least one of a treatment liquid feed and a treatment gas feed for treatment of the disc-shaped objects.

9. The mounting system according to claim 1, wherein the at least two first coupling devices are adapted so that the first and second retaining bars during the transfer process of the disc-shaped objects are spatially fixed by the first support device so that the first and second retaining bars project as unilaterally mounted beams from the first support device.

10. The mounting system according to claim 1, further comprising a third retaining bar.

11. The mounting system according to claim 10, wherein the first, second, and third retaining bars are positioned about the receiving space for the disc-shaped objects so that an angle taken up between adjacent retaining bars amounts to approximately 120° each.

12. The mounting system according to claim 1, wherein the at least two first coupling devices on connecting the first and second retaining bars with the first support device prevent relative movements between the retaining bars and the first support device transversely to the longitudinal axis of the retaining bars.

13. The mounting system according to claim 1, further comprising at least one second coupling device between the first support device and at least the first retaining bar for connecting and disconnecting the first retaining bar with a coupling element of the first support device, wherein the at least one second coupling device is adapted to move from a first position to a second position preventing and allowing, respectively, relative movements between the first and second retaining bars and the coupling element in a parallel direction to the longitudinal axes of the first and second retaining bars.

14. The mounting system according to claim 13, wherein the coupling element comprises at least one locking element adapted to interact positively or frictionally with the first retaining bar.

15. The mounting system according to claim 14, further comprising a lock on at least one longitudinal end of at least the first retaining bar adapted to positively interact with the at least one locking element.

16. The mounting system according to claim 13, wherein the at least one second coupling device is adapted to connect and disconnect the first retaining bar with the coupling element of the first support device by pivoting the first support device via an industrial robot or an operating person about an axis running parallel to the longitudinal axes of the first and second retaining bars and substantially through the center of the first support device.

17. The mounting system according to claim 13, further comprising at least one actuating device arranged on the first support device for positioning the first support device relative to the first and second retaining bars in a parallel direction with respect to the longitudinal axes of the first and second retaining bars, wherein during an adjusting process of the at least one actuating device, the at least one second coupling device is activated and in the process the coupling element of the first support device acts as a driver for the first and second retaining bars.

18. The mounting system according to claim 1, further comprising at least one actuating device arranged on the first support device for positioning the first support device relative to the first and second retaining bars in a parallel direction with respect to the longitudinal axes of the first and second retaining bars.

19. The mounting system according to claim 18, wherein the at least one actuating device comprises at least one guide device which runs parallel to the longitudinal axes of the first and second retaining bars.

20. The mounting system according to claim 18, wherein the at least one actuating device comprises an actuating drive.

21. The mounting system according to claim 18, wherein the coupling element is adjustably mounted by the at least one actuating device in a parallel direction with respect to the axes of the first and second retaining bars relative to a support body of the first support device.

22. The mounting system according to claim 18, wherein the actuating device comprises a travel adjuster dimensioned so that the actuating device causes the at least two first coupling devices to connect and disconnect the first and second retaining bars with the first support device.

23. The mounting system according to claim 1, wherein at least one of the first and second retaining bars further comprises a linear guide or a pivot mounting for removing the at least one of the first and second retaining bars from the receiving space for the disc-shaped objects and for returning the at least one of the first and second retaining bars into the receiving space.

24. The mounting system according to claim 23, wherein the linear guide or pivot mounting comprises an actuating drive for the relative adjustment of the at least one of the first and second retaining bars.

25. The mounting system according to claim 24, wherein the at least one of the first and second retaining bars comprises an additional axial lock adapted to prevent and allow relative movements between the at least one of the first and second retaining bars and the first support device in a parallel direction with respect to the longitudinal axis of the at least one of the first and second retaining bars.

26. The mounting system according to claim 1, wherein the first support device comprises a connection interface to an industrial robot so that the first support device acts as end effector of the industrial robot.

27. The mounting system according to claim 1, wherein the first support device comprises at least one handle for manually gripping the first support device by an operating person.

28. The mounting system according to claim 1, wherein the first support device comprises at least one handle for manual initiation of actuating movements of adjustable elements on the first support device.

29. A treatment device for disc-shaped objects, the treatment device comprising
a rotor arranged in a treatment chamber,
a plurality of outlets for conducting gaseous or liquid chemicals into the treatment chamber, and
a charge opening arranged at an axial end of an axis of rotation of the rotor for introducing a plurality of the disc-shaped objects to be treated,
wherein the rotor is provided for the disconnectable receiving of and connecting to retaining bars of the mounting system according to claim 1.

30. A method for charging a treatment device with a stacked arrangement of disc-shaped objects, the method comprising:
(a) arranging the disc-shaped objects between at least first and second retaining bars comprising first and second supports, respectively, wherein the first and second retaining bars positively engage on edge sections of the disc-shaped objects via the first and second supports;
(b) directly connecting the first and second retaining bars to a first support device via at least two first coupling devices to create a mechanical connection;
(c) subsequently directly connecting the first and second retaining bars to a second support device arranged in the treatment device via at least two second coupling devices; and
(d) subsequently disconnecting the mechanical connection between the first support device and the first and second retaining bars via the at least two first coupling devices.

31. The method according to claim 30, wherein the disc-shaped objects are held between the first retaining bar, the second retaining bar, and a third retaining bar,
wherein the second support device comprises a rotor,
wherein the first, second, and third retaining bars are arranged evenly distributed over a rotational circumference of the rotor, and
wherein via three second coupling devices a positive connection between the first, second, and third retaining bars and the rotor is established.

32. The method according to claim 30, wherein the second support device comprises a rotor, and wherein the first and second retaining bars are exclusively positively held in respective selected positions on a rotational circumference of the rotor by the at least two second coupling devices.

* * * * *